United States Patent [19]

Yamagata

[11] Patent Number: 5,580,381
[45] Date of Patent: Dec. 3, 1996

[54] METHOD OF FORMING CRYSTAL

[75] Inventor: Kenji Yamagata, Kawasaki, Japan

[73] Assignee: Canon Kabushiki Kaisha, Tokyo, Japan

[21] Appl. No.: 552,439

[22] Filed: Nov. 3, 1995

Related U.S. Application Data

[63] Continuation of Ser. No. 448,298, May 23, 1995, abandoned, which is a continuation of Ser. No. 214,001, Mar. 15, 1994, abandoned, which is a continuation of Ser. No. 792,915, Nov. 15, 1991, abandoned.

[30]  Foreign Application Priority Data

| Nov. 15, 1990 | [JP] | Japan | 2-307129 |
| Nov. 15, 1990 | [JP] | Japan | 2-307130 |
| Dec. 18, 1990 | [JP] | Japan | 2-211307 |
| Dec. 18, 1990 | [JP] | Japan | 2-411311 |

[51] Int. Cl.$^6$ .................................................. C30B 25/04
[52] U.S. Cl. ............................... 117/101; 117/84; 437/89
[58] Field of Search .............................. 117/84, 91, 101; 437/89, 913, 90

[56]  References Cited

U.S. PATENT DOCUMENTS

| 3,559,005 | 1/1971 | Vendelin et al. | 257/602 |
| 4,333,792 | 6/1982 | Smith | 156/612 |
| 4,843,025 | 6/1989 | Morita | 437/47 |
| 4,983,539 | 1/1991 | Yamagata et al. | 437/110 |

FOREIGN PATENT DOCUMENTS

| 0244081 | 4/1987 | European Pat. Off. |
| 0284441 | 9/1988 | European Pat. Off. |
| 0365166 | 4/1990 | European Pat. Off. |
| 0366276 | 5/1990 | European Pat. Off. |
| 1-132117 | 5/1989 | Japan |
| 2-209730 | 8/1990 | Japan |

OTHER PUBLICATIONS

"Single Crystal Silicon on Non–Single Crystal Insulators," *Journal of Crystal Growth*, vol. 62, No. 3, 1983, edited by G. W. Cullen.
H. I. Smith et al., "Oriented crystal growth on amorphous substrates using artificial surface–relief gratings," *Applied Physics Letters*, vol. 32, No. 6, Mar. 15, 1978, pp. 349–350.
T. Yonehara et al., "Graphoepitaxy of Ge on $SiO_2$ by solid–state surface–energy–driven grain growth," *Applied Physics Letters*, vol. 45, No. 6, Sep. 15, 1984, pp. 631–633.
M. W. Geis et al., "Crystallographic orientation of silicon on an amorphous substrate using an artificial surface–relief grating and laser crystallization," *Applied Physics Letters*, vol. 35, No. 1, Jul. 1, 1979, pp. 71–74.

*Primary Examiner*—R. Bruce Breneman
*Assistant Examiner*—Felisa C. Garrett
*Attorney, Agent, or Firm*—Fitzpatrick, Cella, Harper & Scinto

[57]  ABSTRACT

A crystal forming method comprises disposing, on a surface of a substrate or in recessed portion formed in the substrate having a surface with a low nucleation density, primary seed having a sufficient small volume to singly aggregate and a rectangular prismatic or cubic shape in which all the sides and the bottom are surrounded by an insulator in contact therewith; performing heat treatment for aggregating the primary seed to form monocrystalline seed crystal having controlled plane orientation and in-plane orientation; and selectively growing monocrystal by crystal growth treatment using the seed crystal as starting point.

15 Claims, 12 Drawing Sheets

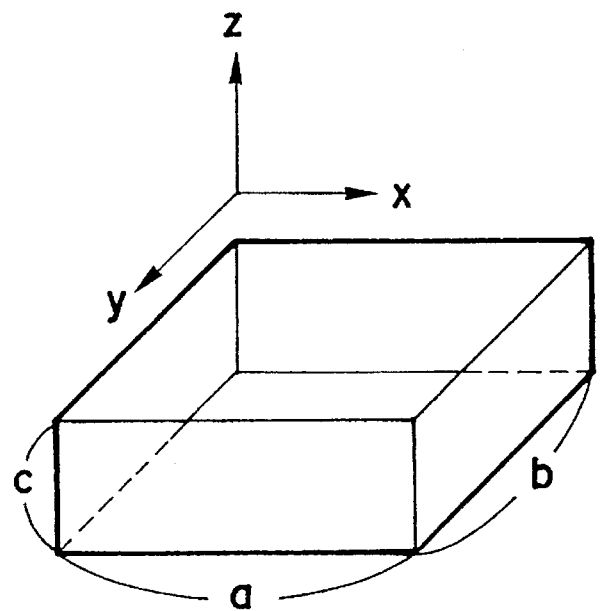
F I G. 1A
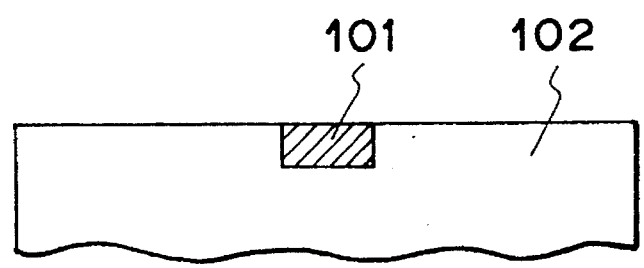
F I G. 1B
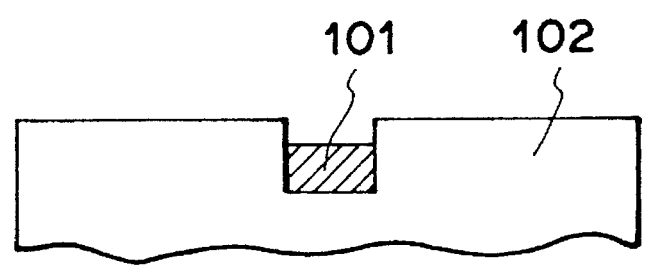
F I G. 1C
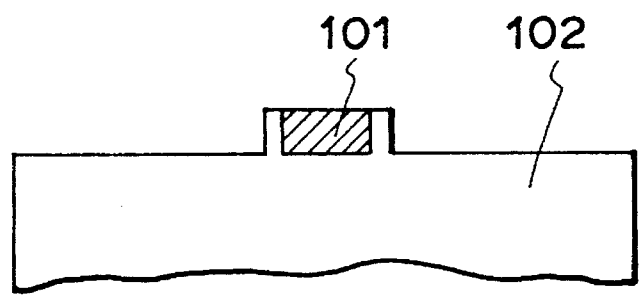
F I G. 1D

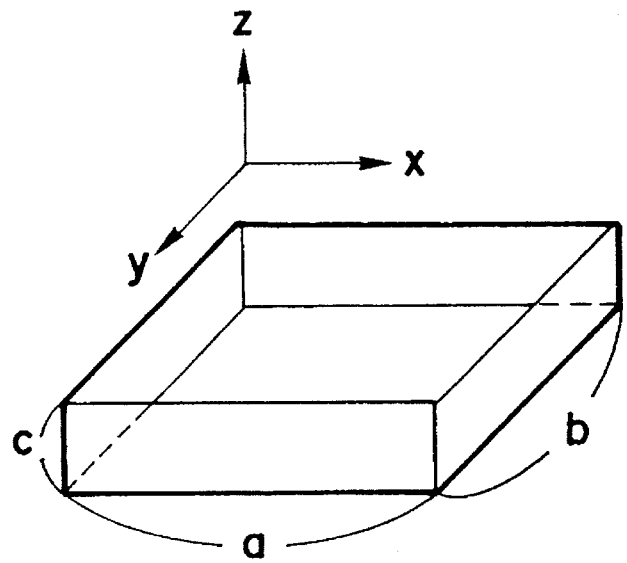
F I G. 6A
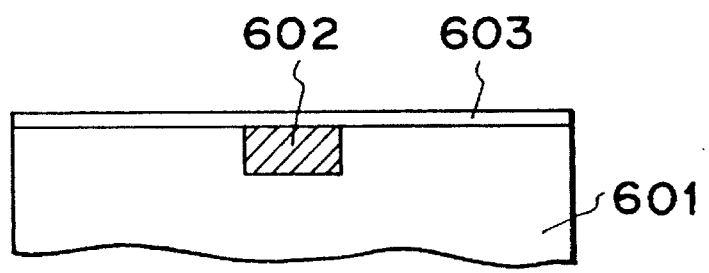
F I G. 6B
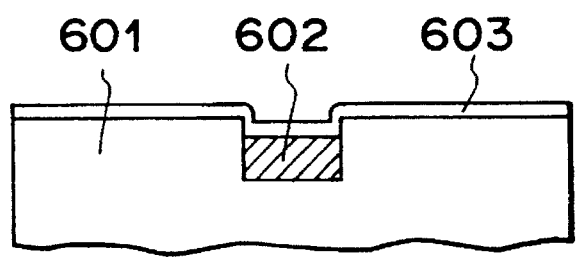
F I G. 6C
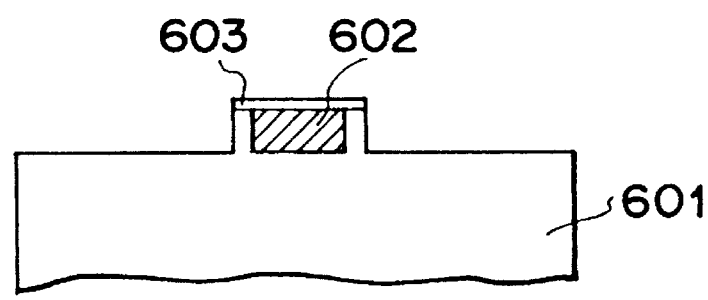
F I G. 6D

METHOD OF FORMING CRYSTAL

This application is a continuation of application Ser. No. 08/448,298 filed on May 23, 1995 now abandoned, which is a continuation of prior application Ser. No. 08/214,001 filed on Mar. 15, 1994 now abandoned, which is a continuation of prior application Ser. No. 07/792,915 filed on Nov. 15, 1991 now abandoned.

BACKGROUND OF THE INVENTION

1. Field of the Invention

The present invention relates to a method of forming a crystal, and particularly to a method of forming a crystal by selectively growing monocrystal on a substrate having a surface with a low nucleation density.

The method of forming a crystal of the present invention is preferably used for electronic devices such as semiconductor integrated circuits, optical integrated circuits and the like, optical devices, magnetic devices, piezoelectric devices, surface acoustic devices and the like.

2. Related Background Art

Monocrystal films used for semiconductor devices and optical devices are generally formed by epitaxially growing monocrystal on a monocrystalline substrate.

For example, it is known that Si, Ge or GaAs is epitaxially grown on a Si monocrystalline substrate (silicon wafer) from a liquid phase, a vapor phase or a solid phase thereof. It is also known that a GaAs or GaAlAs monocrystal is epitaxially grown on a GaAs monocrystalline substrate.

The semiconductor films formed by the above methods are used for producing semiconductor devices, integrated circuits, light emitting devices such as semiconductor lasers, LED and the like.

On the other hand, very high speed transistors which use two-dimensional gases and superlattice elements which use quantum wells have recently actively been researched and developed. These devices can be realized by high precision epitaxial techniques such as MBE (molecular beam epitaxy) using super high vacuum, MOCVD (metal organic chemical vapor deposition) and the like.

Such epitaxial growth on a monocrystalline substrate requires conformity in lattice constant and thermal expansion coefficient between the monocrystalline material of the substrate and the epitaxially grown layer.

For example, although an Si monocrystalline film can be epitaxially grown on sapphire used as an insulator monocrystalline substrate, the crystal lattice defects caused by the difference between the lattice constants at the interface and the diffusion of the aluminum component of sapphire into the epitaxial layer are problems in application to electronic devices and circuits.

As described above, it is known that the conventional methods of forming a monocrystalline film by epitaxial growth are significantly dependent on the substrate material used. Mathews et al. investigated combinations of substrate materials and epitaxially grown layers (EPITAXIAL GROWTH, Academic Press, New York, 1975, edited by J. W. Mathews).

Presently, the size of a substrate is about 6 inches in the case of an Si wafer and the size of a GaAs or sapphire substrate is slightly increased.

In addition, since a monocrystalline substrate is produced at high cost, the cost per chip is increased.

The conventional methods of forming a monocrystalline layer which enables the formation of excellent devices have the problem that the kinds of materials for the substrate are limited to a very narrow range.

On the other hand, there have recently been active research and development of three-dimensional integrated circuits in which a semiconductor device is laminated on a substrate in the direction of a normal line thereof so that an increase in integration and diversification of the function can be achieved.

In addition, large area semiconductor devices such as solar cells, liquid crystal pixel switching transistors and the like in which elements are arrayed on inexpensive glass are increasingly actively researched and developed year after year.

Both types of devices commonly require the technique of forming a semiconductor film on an amorphous insulator and then forming electronic devices such as transistors or the like thereon. Particularly, there is a demand for the technique of forming high-quality monocrystalline semiconductors on an amorphous insulator.

In general, when a thin film is deposited on an amorphous insulator substrate composed of $SiO_2$, the crystal structure of the deposited film is amorphous or polycrystalline due to the absence of long-distance order in the substrate material. The term "an amorphous film" represents a film assuming the state order is held within a short range such as a distance between adjacent atoms but is not held at a longer distance, and the term "a polycrystalline film" represents a film comprising monocrystalline grains having no particular crystal orientation and gathering with grain boundaries which separate the grains from each other.

For example, Si is deposited on $SiO_2$ by a CVD process, amorphous silicon is formed at a deposition temperature of about 600° C. or less, and polycrystalline silicon comprising grains having a size of several hundreds to several thousands Å at a deposition temperature of 600° C. or more. However, the grain size of the polycrystalline silicon formed is significantly dependent on the formation conditions.

Further, an amorphous or polycrystalline film is molten and solidified by using an energy beam generated from a laser or a rod heater to form a polycrystalline film comprising grains having a large size of several microns or millimeters (Single Crystal Silicon on Non-Single Crystal Insulators, Journal of Crystal Growth Vol. 63, No. 3, 1983 edited by G. W. Cullen).

As a result of measurement of electron mobilities of transistors formed on the thin films formed by the above method and having various crystal structures, the mobility of amorphous silicon was ~0.1 $cm^2$/V·sec, the mobility of polycrystalline silicon comprising grains having a size of several hundreds Å was 1 to 10 $cm^2$/V·sec, and the mobility of polycrystalline silicon formed by melting and solidification and comprising large grains was substantially the same as that of monocrystalline silicon.

These results show that the electrical properties of the device formed in a monocrystalline region within a crystal grain are significantly different from those of the device formed on a region including a grain boundary.

Namely, the film deposited on an amorphous substrate has an amorphous or polycrystalline structure, and the device formed on the deposited film has poor properties, as compared with the device formed on a monocrystalline layer. The application of such a device formed on a deposited film is limited to a simple switching element, a solar cell, a photoelectric conversion element or the like.

Methods of depositing a crystal layer on an amorphous substrate are roughly divided into the following two methods.

One method is a method in which an amorphous insulator (for example, $SiO_2$) is coated on a monocrystal (for example, Si) used as a substrate and then partially removed to expose the surface of the ground monocrystal, and a monocrystalline region is then formed on the amorphous insulator layer by horizontal epitaxial growth from a vapor phase, solid phase or liquid phase using the exposed ground monocrystal surface as a seed crystal.

The other method is a method of growing a crystal thin film directly on a substrate without using a monocrystal as a substrate.

As described above, since the surface of an amorphous substrate has no long-distance order, as the surface of a monocrystalline substrate, but holds short-range order only, the deposited thin film at best has a polycrystal structure in which grain boundaries are randomly present. In addition, since both the long-distance order and anisotropy defining crystal orientation (orientation in the normal direction of the substrate and in the surface) are absent in the surface of an amorphous substrate, the crystal orientation of a layer formed on the substrate cannot be controlled.

Namely, a problem of deposition of a monocrystal on an amorphous substrate is to establish a technique of controlling boundary positions and crystal orientation.

A description will now be given of conventional methods of controlling boundary positions and crystal orientation and the problems thereof.

In regard to the control of boundary positions, EP244081A1 publication discloses that boundary positions can be determined by artificially previously defining nucleation positions.

In this technique, for example, $Si_3N_4$ is localized on $SiO_2$, Si monocrystal are grown from $Si_3N_4$ serving as nucleation sites, and grain boundaries are formed by collision between the crystals grown from adjacent nucleation sites, thereby determining boundary positions.

Another technique is also proposed in which a non-monocrystalline material serving as primary seed is previously patterned instead of nuclei which are spontaneously produced at nucleation positions, the material is changed to monocrystal serving as seed crystals by employing aggregation (Japanese Patent laid-Open No. 1-132117).

The plane orientation (crystal orientation in the direction vertical to the substrate) of the crystals grown by the above techniques is determined by the factors such as stabilization of interfacial energy at the amorphous interface with the substrate, stabilization of free surface energy, relaxation of internal stress and so on during the generation of nuclei or aggregation of primary seeds. However, it is difficult to obtain complete orientation in a single direction, and main plane orientation and other orientations are frequently mixed. Particularly, one in-plane crystal orientation is not determined because the nucleation surfaces or aggregation surfaces are amorphous and do not have anisotropy.

On the other hand, H. I. Smith first showed that anisotropy caused by irregularity is artificially provided on the surface of an amorphous substrate by lithography so that the crystal orientation of KCl deposited on the substrate can be controlled, and named this technique "graphoepitaxy" (H. I. Smith and D. C. Flanders, Applied Physics Letters Vol. 32, pp. 349, 1978) (H. I. Smith, U.S. Pat. No. 4,333,792, 1982).

It was later confirmed that an artificial relief pattern formed on the surface of a substrate affects the crystal orientation in the growth of grains in a Ge thin film (T. Yonehara, H. I. Smith, C. V. Thompson and J. E. Palmer, Applied Physics Letters, Vol. 45, pp. 631, 1984) and in the initial growth of Sn (L. S. Darken and D. H. Lowndere, Applied Physics Letters Vol. 40, pp. 954, 1987).

Although it was found that graphoepitaxy has an effect on the orientation of each of separate KCl or Sn crystals deposited in an initial stage, there have also been reports of continuous layers, e.g., an Si layer formed by laser annealing crystal growth after deposition (M. W. Ceis, D. A. Flanders and H. I. Smith, Applied Physics Letters, Vol. 35, pp. 71, 1979) and a Ge layer formed by solid phase growth (T. Yonehara, H. I. Smith, C. V. Thompson and J. E. Palmer, Applied Physics Letters, Vol. 45, pp. 631, 1984).

However, in the cases of Si, Ge layers, although orientation is controlled to some extent, a crystal group is arranged in a mosaic pattern, and grain boundaries are randomly present between crystals having slightly different crystal orientations. It is thus impossible to obtain monocrystal uniformly arranged in a large area.

The reason for this is that the three-dimensional crystal orientations of respective crystals are not completely the same, and the nucleation positions cannot be controlled by a surface relief pattern.

SUMMARY OF THE INVENTION

It is an object of the present invention to provide a method of forming a crystal which is capable of growing monocrystal having grain boundaries at controlled positions and the same plane orientation and in-plane orientation.

It is another object of the present invention to provide a method which is capable of uniformly and simply forming monocrystal having a single orientation in a large area without producing a plurality of orientations other than main orientation.

BRIEF DESCRIPTION OF THE DRAWINGS

FIG. 1A is a schematic drawing showing an example of a primary seed used in a method of forming a crystal of the present invention;

FIGS. 1B to 1D are schematic drawings respectively showing the shapes of insulators surrounding primary seed;

FIG. 6A is a schematic drawing showing an example of a primary seed in a method of forming a crystal of the present invention;

FIGS. 6B to 6D are schematic drawings respectively showing the shapes of insulators surrounding a primary seed;

DETAILED DESCRIPTION OF THE PREFERRED EMBODIMENTS

Figure 2A:
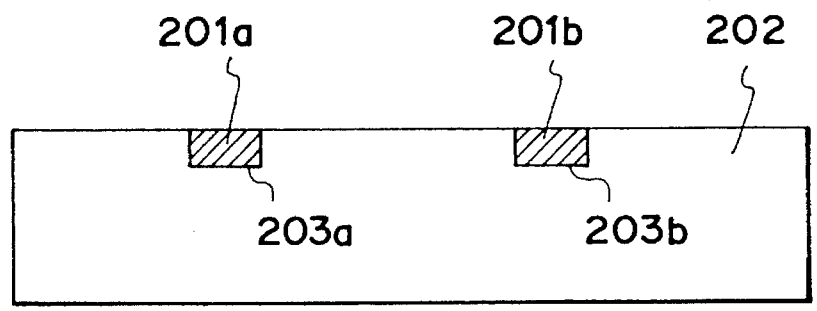
FIGS. 2A to 2D are schematic drawings showing an example of methods of forming crystals of the present invention.

Preferred embodiments of a crystal forming method of the present invention are described below.

A method of forming a crystal of the present invention comprises disposing primary seed having side walls and a bottom, all of which contact with an insulator, having a rectangular prismatic or cubic shape and a volume sufficiently small to singly aggregate on a substrate having a surface with a low nucleation density or in recessed portions formed in the substrate; performing heat treatment for inducing aggregation in the primary seed to form monocrystalline seed crystal having controlled plane orientation and in-plane orientation; and performing crystal growth treatment for selectively growing monocrystal using the seed crystal as a starting point.

In another preferred form, the method of forming a crystal of the present invention comprises disposing monocrystalline seed crystal on a substrate, and growing monocrystal using the seed crystal as a starting point, wherein a recessed portion having at least an angular portion formed by three surfaces including the bottom and two sides, all of which vertically contact with each other, is formed in the surface of the substrate so that primary seed is disposed in the angular portion so as to contact with the three surfaces and is then singly aggregated by heat treatment to form a monocrystalline seed crystal, and monocrystal is grown using the seed crystal as starting point.

In a further preferred form, the method of forming a crystal of the present invention comprises disposing a primary seed having surfaces, all of which contact with an insulator, and a rectangular prismatic or cubic shape on a substrate having a surface with a low nucleation density or in a recessed portion formed in the substrate; melting and then solidifying the primary seed to form monocrystal having controlled plane orientation and in-plane orientation; at least partially removing the insulator covering the monocrystal to expose the monocrystalline surface; and selectively growing monocrystal using the exposed monocrystal as starting point by crystal growth treatment.

In a still further preferred form, the method of forming crystal of the present invention comprises disposing a seed crystal on a substrate and growing monocrystal using the seed crystal as a starting point, wherein a recessed portion having at least an angular portion formed by three surfaces including the bottom and two sides, which vertically contact with each other, is formed in the surface of the substrate, primary seed is disposed in the angular portions so as to contact with the three surfaces and molten and then solidified to form monocrystalline seed crystal, and monocrystal is grown using the seed crystal as a starting point.

The method of forming crystals of the present invention enables the selective growth of monocrystal from monocrystalline seed crystal serving as a starting point and having controlled plane orientation and in-plane orientation and thus enables the formation of monocrystal having controlled grain boundaries and uniform plane orientation and in-plane orientation on an insulating substrate.

The present invention also permits a primary seed which has a rectangular prismatic or cubic shape to have surfaces in contact with an insulator and which is changed to monocrystal by melting and solidification to be changed from non-monocrystal to monocrystal having uniform plane orientation and in-plane orientation. When a semiconductor material is selectively grown by using the monocrystal as seed crystal, SOI devices can be formed with controlled boundary positions and uniform plane orientation and in-plane orientation.

The present invention is capable of completely controlling the boundary positions (number) and orientation, which cause deviations in properties of SOI device, and thus forming a device with high uniformity.

In addition, since melting and solidification on the three vertical surfaces at an angular portion of recessed portion in the substrate has good effects on the plane orientation and in-plane orientation of seed crystals, the present invention is capable of uniformly and simply forming monocrystal over a large area with a single orientation without a plurality of orientations other than main orientation.

Further, since the three vertical surfaces at angular portions of a recessed portion in the substrate have good functions as equivalent surfaces to the stable orientation structure of the seed crystal formed by aggregation, the present invention is capable of uniformly and simply forming monocrystal over a large area with a single orientation without a plurality of orientations other than main orientation.

The plane orientation of a crystal formed by aggregation or melting and solidification is determined so that the free surface energy of the crystal and the interfacial energy at the interface with the substrate are minimum, as described above. For example, when polycrystalline Si is aggregated on $SiO_2$, since the free surface energy of Si is minimum on the (111) plane, the plane orientation is produced along the (111) plane. On the other hand, since the Si—$SiO_2$ interfacial energy is stable on the (100) plane, the interfacial energy is conformed to the (100) plane. In addition, since polycrystalline Si generally has (110) orientation depending upon the deposition temperature, the factor of the initial state also has an influence on the orientation. As a result, Si aggregated on $SiO_2$ is relatively strongly oriented on the (111) plane, having (110) orientation with a ratio of about ½ to ⅓ of (111) orientation in terms of the reflection intensity in X-ray diffraction. In X-ray diffraction, weak peaks of (100), (311), (331), (422) and so on are also observed. Possible reasons for domination of (111) orientation are that aggregated Si comprises semispherical crystal and has a surface area significantly greater than the area of the interface, and that the stabilization of free surface energy among the factors for determining orientation is the most important factor.

However, since many factors influence orientation, it is very difficult to completely control a single orientation even by changing the material of the substrate surface or aggregation conditions. Moreover, it is substantially impossible to control the in-plane orientation by aggregation on a two-dimensional surface.

The inventors thus conceived an arrangement in which the stabilization of interfacial energy is a main factor which determines orientation for controlling a single orientation and then an arrangement in which in-plane orientation is further controlled. Both arrangements can be satisfied by the arrangement of the present invention which is obtained by aggregating a primary seed having a rectangular prismatic or cubic shape formed so as to be surrounded by an insulator in contact with the sides and the bottom thereof and having a small volume sufficient to singly aggregate.

A typical example of primary seed is shown in FIG. 1A. However, the rectangular prism (or cube) shown in the drawing is surrounded by an insulator in contact with all the surfaces thereof excepting one surface (the upper surface of the xy plane).

Although the stabilization of interfacial energy during aggregation is affected by the bottom of a primary seed and only one of the surfaces of an insulator in conventional methods, in the crystal forming method of the present invention, the five surfaces contribute to the stabilization of the interfacial energy and respectively intersect the adjacent surfaces. The method of the present invention thus has the advantage that the five surfaces functions as equivalent surfaces to the stable orientation structure of a crystal formed by aggregation. In addition, since the exposed area is smaller than that in the conventional methods, the method of the present invention has the effect of decreasing the influence of stabilization of interfacial energy on changes in the structure during aggregation. As a result, the control of orientation (including in-plane orientation) which is produced in graphoepitaxy or growth of Ge grain which takes plane in a surface relief structure can be reproduced in an aggregation system comprising primary seeds.

Embodiments of the present invention are described below with reference to FIGS. 1A to 1D and FIGS. 2A to 2D.

Embodiment

Initially, a description is first made of the shape and size of a primary seed which is most important in the present invention.

Although the shape of a primary seed must be a rectangular prismatic or cubic shape, as described above, strictly speaking, the objects of the present invention can be achieved even if the shape of the primary seed is not a completely rectangular prismatic or cubic shape. Conversely, if a primary seed has a completely rectangular prismatic shape, it is difficult to provide a monocrystalline seed with specified orientation in the direction vertical to a surface of an insulator without deviation of several second degrees even by aggregating the primary seed surrounded by the insulator. If the crystals grown from such seed crystals collide with each other, grain boundaries are invariably produced. In the present invention, it is therefore sufficient that the position of grain boundaries is controlled, and no deviation occurs in the properties of devices due to deviations in orientation during the production of devices. Namely, deviations from design values which are caused by sagging or over etching produced at the pattern edge in a photolithographic process or etching process, i.e., an angle of several degrees or less, is allowable.

The terms "a rectangular prismatic or cubic primary seed surrounded by an insulator in contact with the side walls and the bottom thereof" represent, for example, the shape shown in FIGS. 1B, 1C or 1D. FIGS. 1B and 1C show so-called "buried type" shapes. These buried type shapes are formed by partially patterning the surface of an insulator substrate 102 with squares or rectangles and etching the surface to form rectangular prismatic or cubic space and respectively burying the primary seed in the space formed. In this case, a primary seed 101 to be buried may have a shape which causes the exposed surface to be at the same level as that of the surface of the insulator, i.e., which makes the whole surface flat, as shown in FIG. 1B, or a shape which causes the exposed surface to be at a level lower than that of the insulator surface, i.e., which has a height (the $c$ value shown in FIG. 1A) smaller than the etching depth. On the other hand, FIG. 1D shows "a side-wall formation type". This type is formed by patterning a primary seed in a rectangular prismatic or cubic region on an insulator substrate or a substrate having an insulator surface layer and then forming an insulator on the side walls of the primary seed leaving the upper surface so as to surround the primary seed.

In any one of the cases, the material of the side walls need not be the same as the material of the substrate 102. For example, in the case of the buried type, a rectangular prismatic or cubic space is formed in the substrate, and an insulating film is formed in the space formed so that the surfaces of the insulating film are used as insulator side walls.

The size of the primary speed is described below. In the shape shown in FIG. 1A, the primary seed has a, b values which are preferably a, b<2 μm (both values may be the same, a=b), more preferably 1 μm or less, and most preferably about 0.5 μm. This is because, if the a, b values exceed 2 μm, the primary seed is not singly aggregated but aggregated in a form divided into a plurality of portions. Whether the seed crystal is divided or not significantly depends upon the thickness of the film, i.e., the $c$ value, and if the aspect ratio between the value $a$ or $b$ and the value $c$ is high, the seed crystal is easily divided. The reason for determining the optimum a, b values of about 0.5 μm is that if the $a$, $b$ values are set to be 0.5 μm or less, a general semiconductor photoprocess cannot be easily applied to the primary seed. On the other hand, the thickness (=$c$) of the primary seed is preferably 0.05 to 0.5 μm, and more preferably 0.1 to 0.4 μm. The optimum thickness is determined by the values $a$ and $b$. Although the smaller the thickness is, the more easily aggregation takes place, if the thickness is less than 0.05 μm, the values $a$, $b$ must be decreased for singly aggregating the primary seed. This causes the problems that a general photoprocess cannot be easily applied, as described above, and that the effect of the side walls for controlling orientation is decreased. If the value c is greater than 0.5 μm, aggregation does not easily take place. The optimum value of the thickness is therefore within the range of 0.5>c>0.05 (μm).

Examples of materials that can be used for the primary seed to be aggregated include semiconductor elements such as Si, Ge, Sn and the like; metals such as Au, Ag, Cu, Pt, Pd and the like; alloys; compounds and mixtures thereof.

An amorphous insulator such as $SiO_2$, $Si_xN_y$, SiON or the like is used as an insulator which forms non-nucleation surfaces. The composition of the insulator which forms the non-nucleation surfaces need not to be the same as that of the insulator in the portions contacting with the primary seed.

The process in an embodiment of the present invention is described below with reference to FIGS. 2A to 2D.

As shown in FIG. 2A, a substance used for primary seeds 201a, 201b is buried in small recessed portions 203a, 203b in an insulator substrate 202 or a substrate having a surface layer covered with an insulator. Each of the recessed portions 203a, 230b has a rectangular prismatic or cubic form. As described above, the recessed portions 203a, 203b need not be formed in the substrate, and the side walls of each of the primary sees 201a, 201b may be surrounded by an insulator in contact therewith.

Although Si, Ge or the like is used as a material for the primary seeds 201a, 201b, as described above, a polycrystal or an amorphous material may be used.

Figure 2B:
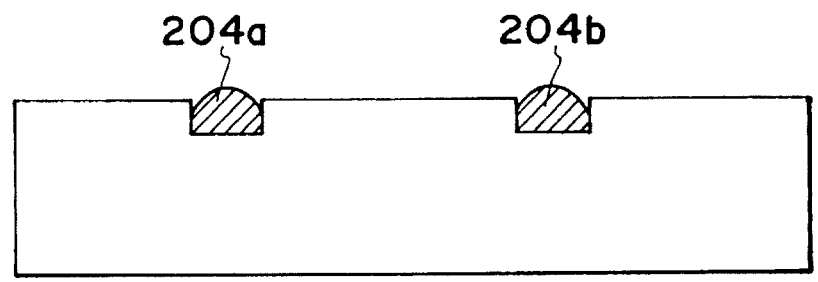

As shown in FIG. 2B, the primary seeds 201a, 201b are then subjected to heat treatment in an atmosphere of hydrogen so that aggregation takes place to form seed crystals 204a, 204b having uniform plane orientation and in-plane orientation. Although the conditions of heat treatment depend upon the material use for the primary seeds and the volume thereof, when the material for the primary seeds is a semiconductor element such as Si, Ge or the like, the temperature is generally about 700° to 1100° C. Although the pressure may be atmospheric pressure, heat treatment is preferably performed under reduced pressure (several Torr to 200 Torr) so that aggregation easily takes place. Doping of the primary seeds with large quantities of impurities (phosphorus, boron, arsenic or the like) has the effect of decreasing the aggregation starting temperature.

Figure 2C:
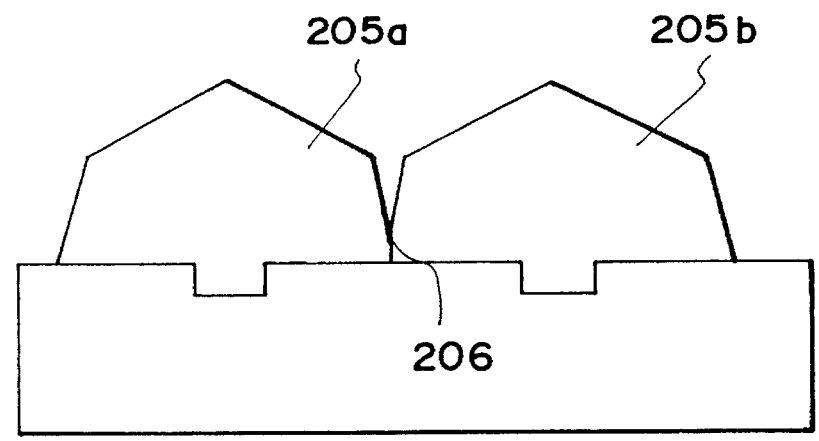

As shown in FIG. 2C, monocrystals are selectively grown from the monocrystalline seed crystals formed by aggregation and serving as centers. The crystal growth is effected by the CVD process. For example, when Si crystals are grown, the growth can be achieved at a temperature of 800° to 1200° C. by using as a source gas a silane type gas such as $SiH_4$, $Si_2H_6$ or the like, a chlorosilane type gas such as $SiH_2Cl$, $SiHCl_3$, $SiCl_4$ or the like, or a fluorosilane gas such as $SiH_2F_2$, $SiF_4$ or the like, which source gas is mixed with etching gas such as HCl or the like in $H_2$ dilution gas.

A grain boundary 206 is produced between the crystal 205a grown from the seed crystal 204a and the crystal 205b similarly grown from the adjacent seed crystal 204b at an intermediate position between the adjacent seed crystals which are first patterned. If the two crystals 205a, 205b originally have the completely same orientation including in-plane orientation, a continuous crystal film is formed without any grain boundaries. However, in fact, there are slight deviations in crystal orientation between crystals, grain boundaries are formed in most cases.

Figure 2D:
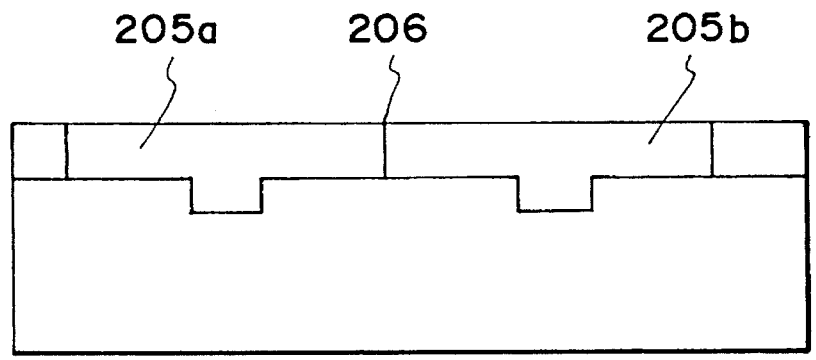

Each of the grown crystals 205a, 205b is a monocrystal and thus has a crystal face (facet) peculiar to the crystal. When electronic devices are formed on the grown crystals, therefore, the crystals are polished to form a flat surface as occasion demands, as shown in FIG. 2D.

Another embodiment of the present invention is described below.

The crystal forming method comprises disposing monocrystalline seed crystal on a substrate, and growing monocrystal using the seed crystal as starting point, wherein a recessed portion having at least an angular portion where three surfaces comprising the bottom and two sides vertically contact with each other is formed in the substrate, a primary seed is disposed in the angular portions so as to contact with the three surfaces and then subjected to heat treatment for singly aggregating the primary seed to form monocrystalline seed crystal, and monocrystal is then grown using the seed crystal as starting point.

Figure 11:
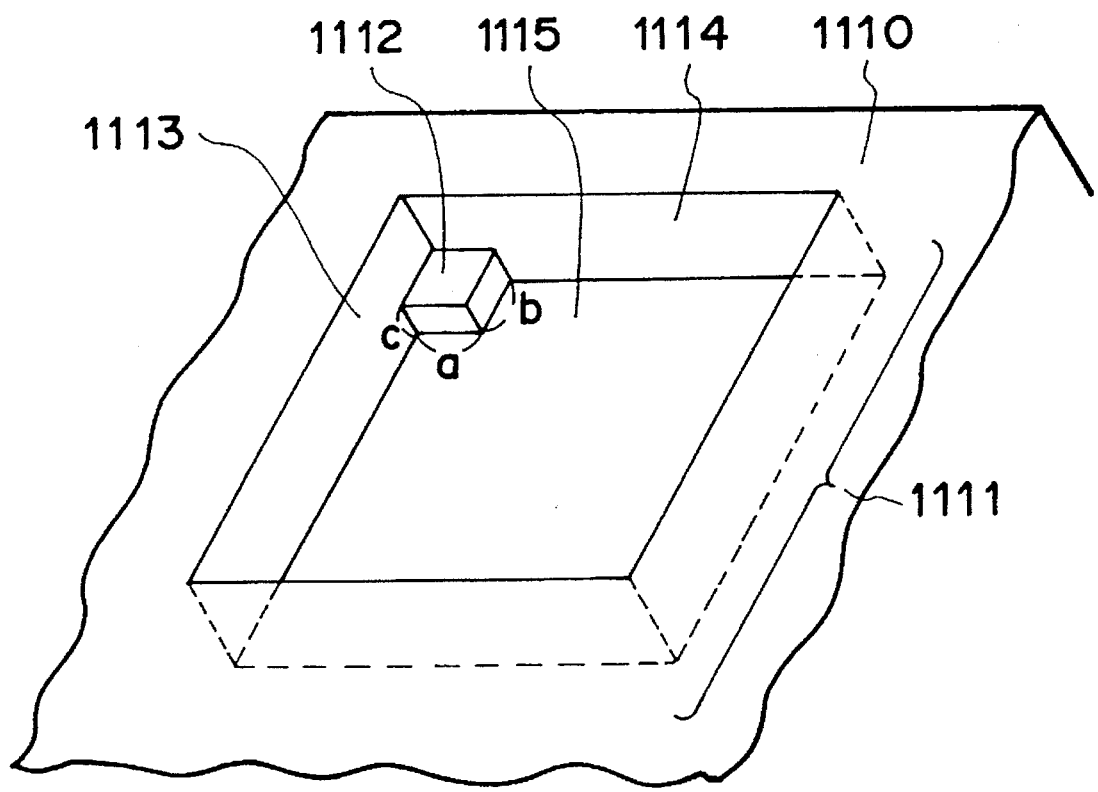
FIG. 11 is a schematic drawing showing an example in which a primary seed is formed in a recessed portion formed in a substrate.
Figure 12:
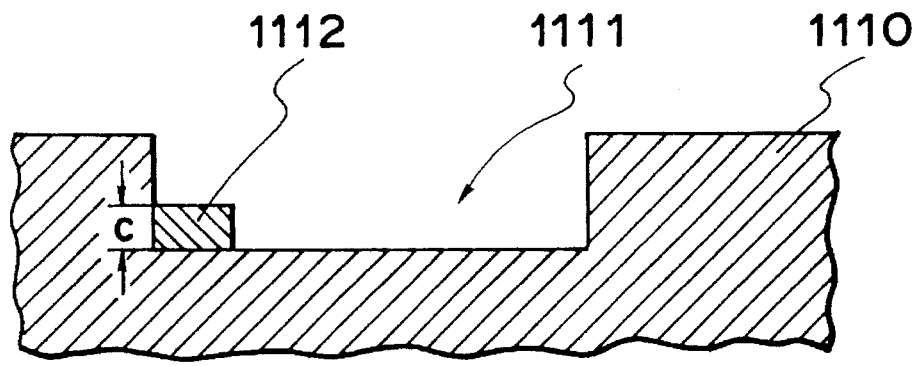
FIG. 12 is a partially sectional view of the recessed portion and the primary seed shown in FIG. 11.

FIG. 11 is a schematic drawing showing a recessed portion (crystal growth region) formed in a substrate, and a primary seed formed in the recessed portion. FIG. 12 is a sectional view of the recessed portion and the primary seed shown in FIG. 11.

In the example shown in FIGS. 11 and 12, a primary seed 1112 is formed so as to contact with the sides 1113, 1114 and the bottom 1115 of a recessed portion (crystal growth region) 1111. In this example, the sides 1113, 1114 and the bottom 1115 must be respectively positioned as vertical surfaces. The three surfaces 1113 to 1115 function well during aggregation, as described above.

The terms "the three surfaces 1113 to 1115 are vertical to each other" represent that the surfaces are strictly vertical or substantially vertical to each other. For example, even if error of several degrees or less is produced in the angle of the surfaces due to sags produced at pattern edges or deviations from the design values, which are caused by over etching, in a usual photolithographic process, etching process or the like, the surfaces are considered vertical in the present invention. In this case, the effects of the present invention can be obtained.

Even if the surfaces 1113 to 1115 are formed in substantially completely vertical surfaces, it is impossible that many monocrystalline seed crystals have specified orientation without deviation of several seconds degrees. In the present invention, therefore, the three surfaces may be vertical to the extent which causes no deviation in the properties of devices to be produced due to deviation in orientation during the production of devices in many crystal regions.

The shape of the primary seed 1112 is not particularly limited. However, since the primary seed 1112 is disposed so as to contact with the three surfaces 1113 to 1115, as shown in FIG. 11, the contact portions of the primary seed 1112 are inevitably three vertical surfaces. The shapes of the portions of the primary seed 1112, which do not contact with the surfaces 1113 to 1115, are not particularly limited, and the portions may be formed in any shapes which can be easily formed.

The size of the primary seed 1112 may be sufficient small to singly aggregate. When the primary seed 1112 has a rectangular prismatic shape, as shown in FIG. 11, the length of each of the two sides $\underline{a}$ and $\underline{b}$ of the bottom is preferably 2 μm or less, more preferably 1 μm or less, and most preferably about 0.5 μm. If the length exceeds 2 μm, the primary seed 1112 is sometimes aggregated in a form divided into a plurality of portions, not in a single body. Such a plurality of portions do not serve as seed crystals for growing a monocrystal. However, whether the primary seed 1112 is divided or not during aggregation significantly depends upon the value of the thickness (height) $\underline{c}$ of the primary seed. If the aspect ratio between the value $\underline{a}$ or $\underline{b}$ to the value $\underline{c}$ is high, the primary seed 1112 is easily divided during aggregation.

It is preferable that both the values $\underline{a}$ and $\underline{b}$ are at least 0.1 μm. If these values are less than 0.1 μm, there is the tendency that the control of orientation caused by interfacial stabilization energy becomes difficult due to a significant decrease in the bottom area. In addition, when a usual photolithographic apparatus is used, it is difficult to pattern with a length of less than 0.1 μm. The values $\underline{a}$ and $\underline{b}$ need not be the same.

The thickness (height) $\underline{c}$ of the primary seed 1112 is preferably 0.05 μm to 0.5 μm, and more preferably 0.1 μm to 0.4 μm. The optimum value of the thickness $\underline{c}$ is determined by the values $\underline{a}$ and $\underline{b}$. In fact, the smaller the value $\underline{c}$, i.e., the thinner the primary seed 1112, the more easily aggregation takes place. However, if the value $\underline{c}$ is 0.1 μm or less, since the values $\underline{a}$ and $\underline{b}$ must be also decreased so that the primary seed is not divided during aggregation, as described above, the effects of the surfaces 1113 to 1115 on the control of in-plane orientation are decreased. It is also difficult to apply a general photoprocess. If the value $\underline{c}$ exceeds 0.5 μm, there is the tendency that aggregation does not easily take place.

Even when the shape of the primary seed 1112 is not a rectangular prism, it is preferable that the sizes of the portions in direct contact with the surfaces 1113 to 1115 are values equivalent to the above values which may be regarded as standard values.

Examples of materials that can be used as the material for the primary seed 1112 include semiconductor elements such as Si, Ge, Sn and the like; metals such as Au, Ag, Cu, Pt, Pd and the like; alloys, compounds and mixtures thereof, all of which are generally known as materials for primary seeds.

Various materials such as amorphous insulators such as $SiO_2$, $Si_xN_y$, $SiON_x$ and the like, which are generally known as substrate materials for forming crystals, can be used for a substrate 1110 having the recessed portion 1111. It is effective to use a substrate having a relatively low nucleation density over the whole substrate or only on a surface thereof. It is more effective to use a substrate comprising an amorphous insulator over the whole substrate or only on a surface thereof.

The processes in the above-described embodiment of the present invention are described with reference to FIG. 13.

Figure 13A:
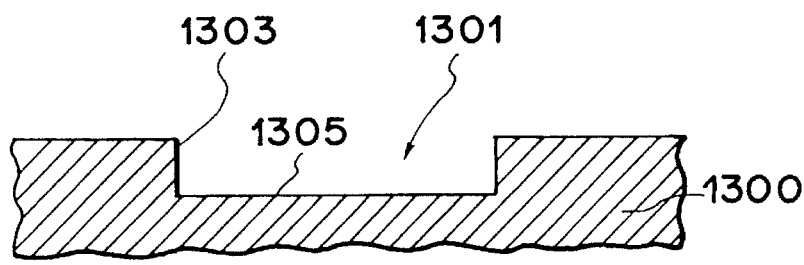
FIGS. 13A to 13F are schematic drawings showing another example of processes in a method of forming a crystal of the present invention.

As shown in FIG. 13A, recessed portions 1301 serving as crystal growth regions are first formed in a substrate 1300. Although the plane shape of each of the recessed portions 1301 may be patterned so that a portion where the primary seed is disposed is formed in a desired angular portion, a square or rectangle is preferable. Although the depth of the recessed portion 1301 may be any desired value, the value of the depth is preferably the same as the working thickness of the film later grown. Although the method of forming the recessed portions 1301 is not particularly limited, for example, RIE (reactive ion etching) is more preferable than wet etching using an etching solution because the sides 1303 of the recessed portion 1301 formed by the former method are more vertical to the bottom than the sides formed by the latter method.

Figure 13B:
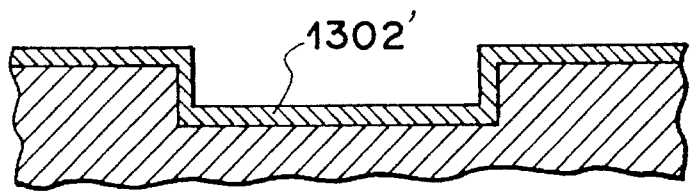

As shown in FIG. 13B, a material 1302' for the primary seeds is then deposited. As described above, Si, Ge, Sn or the like can be used as the material 1302', and the material 1302' may be either polycrystalline or amorphous. Although the preferable value of the thickness of the deposited film is described above, the value of the thickness must be smaller than the depth of the recessed portion 1301. Examples of deposition methods include an evaporation process, a sputtering process, a CVD process and the like. However, the evaporation process and sputtering process, both of which exhibit poor step coverage, are preferable because it is undesirable that the primary seed material 1302' unnecessarily remains on the sides of the recessed portions 1301 during the latter process.

Figure 13C:
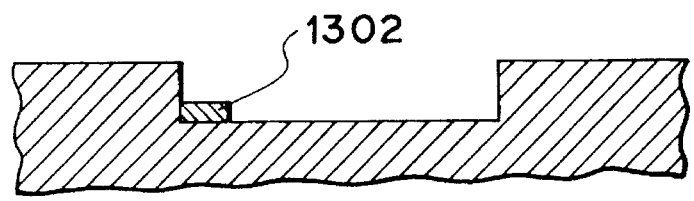

Etching is then performed with leaving the primary seed 1302 in a desired angular portion in the crystal growth region, as shown in FIG. 13C. The etching may be performed by either a dry method using RIE or a wet method using a solution. The preferable values of the size of primary seed 1302 is as described above with reference to FIG. 11.

Figure 13D:
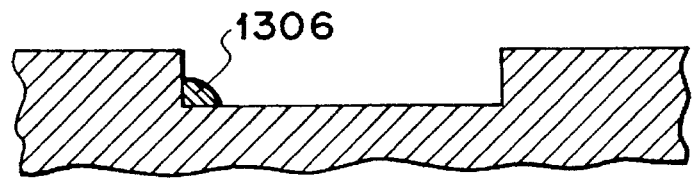

The primary seed 1302 is then subjected to heat treatment for aggregation in an atmosphere of hydrogen to form a seed crystal 1206 having uniform plane orientation and in-plane orientation, as shown in FIG. 13D. Although the conditions of the heat treatment depend upon the material of the primary seed 1302 and the volume thereof, when the primary seed material is a semiconductor element such as Si, Ge or the like, the temperature of the heat treatment is generally about 700° to 1100° C. Although the pressure may be atmospheric pressure, aggregation is easily produced by the heat treatment at reduced pressure (several Torr to 200 Torr). In addition, doping of the primary seed 1302 with large quantities of impurities (phosphorus, arsenic, boron or the like) has the effect of decreasing the aggregation starting temperature.

Figure 13E:
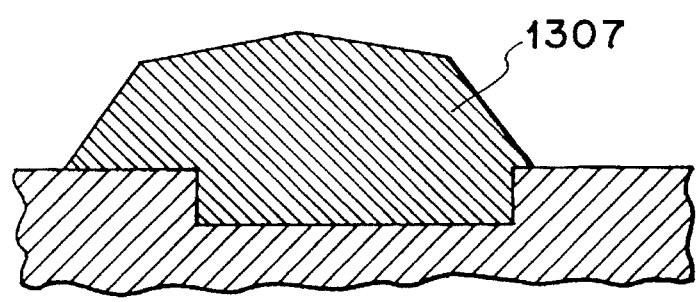

Crystal 1307 is then selectively grown from the seed crystal 1306 serving as centers by the CVD process or the like, as shown in FIG. 13E. For example, when Si crystal is grown by the CVD process, a silane type gas such as $SiH_4$, $Si_2H_6$ or the like, a chlorosilane type gas such as $SiH_2Cl_2$, $SiHCl_3$, $SiCl_4$ or the like, or a fluorosilane type gas such as $SiH_2F_2$, $SiF_4$ or the like may be used as a source gas. The Si crystal can be grown by mixing the source gas with etching gas such as HCl, HF or the like in $H_2$ dilution gas. The crystal growth by the CVD process may be performed at a temperature within the range of about 800° to 1200° C. and pressure within the range of several Torr to about 200 Torr. The crystal growth may be performed until the recessed portion serving as the crystal growth region is completely filled with crystal. The grown crystal 1307 has a facet peculiar to a monocrystal. In this way, the grown crystal 1307 can be easily determined by the size and shape of the recessed portion 1301.

Figure 13F:
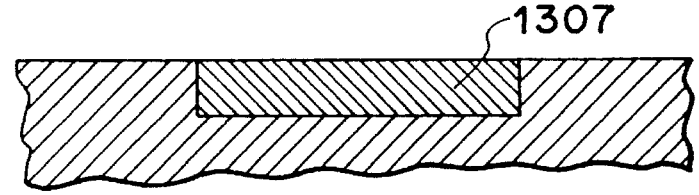

As shown in FIG. 13F, the portion of the crystal 1307 which protrudes from the recessed portion 1301 is then removed so that the substrate 1300 and the crystal 1307 are flattened, whereby devices or the like can be easily preferably formed on the flat surface, and circuits can also easily be formed.

The flattening is preferably performed by, for example, a selective polishing method. The selective polishing method includes the two types of methods below. One of the methods is "mechanochemical polishing" in which chemical reaction with Si is produced by using an alkali solution, and the reaction product is removed (Hamaguchi, Endoh, Bulletin of the Applied Physical Society, Vol. 56, No. 11, pp. 1480). The other method is "mechanical polishing (Japanese Patent Laid-Open No. 2-209730) which employs a difference in mechanical polishing rates for polishing only a substance to be polished (corresponding to the crystals 1307 shown in FIG. 13) having a high mechanical polishing rate using abrasive grains of colloidal silica or the like, and stopping polishing on the stopper surface (corresponding to the substrate 1300 shown in FIG. 13) having a low mechanical polishing rate. Although the latter mechanical polishing is effective for the case of random crystal orientation, since the crystal grown in the present invention has uniform orientation, either of the above methods can be used. From the viewpoint of this, the method of present invention is excellent.

Although the above crystal forming method of the present invention employs aggregation, the crystal forming method of the present invention which employs melting is described below.

For example, when polycrystalline Si is melted and solidified on $SiO_2$, since the surface energy of Si itself is stable in (111) orientation, but Si—$SiO_2$ interfacial energy is stable in (100) orientation, the strong function of the stabilization factor of the interfacial energy results in (100) orientation. However, the Si film has (100) orientation with respect to the plane of the substrate, but the orientation in the plane of the substrate is not at all controlled. In addition, when a film formed by simply melting and solidification, since there are many solidification starting points in the plane, many grains are formed and random grain boundaries are consequently produced.

In the present invention, the inventor conceived a structure for controlling the in-plane orientation of each grain and the positions of the grain boundaries produced by slight deviation in orientation.

In the control of orientation, it was first confirmed that the orientation vertical to the plane of the substrate is controlled to predetermined orientation by melting and solidifying the film material. Since no information about in-plane orientation is provided, information about the control of horizontal orientation is provided by forming the side walls (surfaces) vertical to the plane of the substrate. The side walls are formed so that four surfaces are vertical to each other, i.e., the portion surrounded by the surfaces forms a rectangular prism or a cube, thereby providing information about orientation control from the four directions. In addition, since the rectangular prism or cube formed must comprise a monocrystal containing no grain boundary during melting and solidification, and since the walls must affect the whole primary seed having a rectangular prismatic or cubic shape, the rectangular prism or cube must be designed so as to have an appropriate volume. Typical values of the size of the rectangular prism or cube are described below.

The position of grain boundary can be controlled by patterning primary seed having a rectangular prismatic or cubic shape at desired positions. Namely, when primary seeds are patterned at desired two positions, crystals are respectively grown from the primary seeds and collide with each other at just an intermediate position between the two points to form a grain boundary. For example, when primary seeds are patterned at lattice points at distances 1, grain boundaries are formed at intermediate positions between the respective lattice points. As a result, square crystals each having sides 1 are regularly arranged in a lattice form. Although it is thought that when crystals having completely uniform plane orientation and in-plane orientation collide with each other, no grain boundary is generated, grain boundaries are in fact produced because it is difficult to form and grow seed crystals without deviation of only 1 second degree in the direction vertical to the substrate and the in-plane direction thereof. In short, it is sufficient that the positions of grain boundaries are controlled, and no deviation is produced in the properties of devices due to deviation in orientation during the production of the devices. Slags produced at the pattern edges or deviations from the design values, which are caused by over etching, in a usual photolithographic process or etching process, i.e., angles of several degrees or less, are allowable.

A description will now be made of the method of forming a crystal film having controlled plane orientation and in-plane orientation on an insulating substrate using the seed crystals formed on the basis of the above-described idea.

The shape and volume of a primary seed are described below. As shown in FIG. 6A, a primary seed has a rectangular prismatic shape (or a cubic shape (a=b=c)). This is because when a certain orientation is preferential in one surface of a rectangular prism or cube, orientations equivalent to that orientation are preferential in all the other surfaces thereof.

The volume of a primary seed must be sufficiently small to generate no grain boundary in the primary seed during melting and solidification, and the area of the sides are sufficiently large to stably determine in-plane orientation, as described above. Specifically, the value $a$ of the primary seed shown in FIG. 6A is preferably within the range of 0.1 μm to 5 μm, and more preferably within the range of 0.5 μm to 2 μm, assuming that a=b. The optimum value depends upon the materials for the primary seed and the substrate. The minimum value is determined by the limit value of precision of the photolithographic method or the minimum area which permits the stabilization energy at the interface with the substrate to control orientation. The maximum value is experimentally determined so that no grain boundary is produced during solidification. However, this maximum value is related to the value of the height $c$ of the sides.

The value of the height $c$ of the sides of the rectangular prism or cube is preferably within the range of 0.1 μm to 2 μm, and more preferably within the range of 0.3 μm to 1 μm. The optimum value depends upon the values $a$ and $b$ and the material for the primary seed. The minimum value is determined to be a minimum value which allows the sides to affect the determination of in-plane orientation. The maximum value is determined to be a value which does not cause the formation of grain boundary during solidification.

All the surfaces of a primary seed must be covered with an insulator, as shown in FIGS. 6B, 6C and 6D. FIGS. 6B and 6C respectively show "buried types" of primary seeds. In the buried types, the surface of an insulator substrate 601 is partially patterned with squares or rectangles and then etched to form rectangular prismatic or cubic shapes in the substrate, a primary seed 602 is respectively buried in the spaces, and an insulating film is then formed thereon. In this case, the upper surfaces of the primary seed may be at the same level as that of the surface of the insulator substrate 602, i.e., the whole surface becomes flat, as shown in FIG. 6B, or the upper surfaces of the primary seed may be lower than that of the insulator surface, i.e., the height $c$ of each primary seed may be smaller than the etching depth, as shown in FIG. 6C.

On the other hand, FIG. 6D shows "a side wall formation type". In this type, the primary seed 602 is first patterned in rectangular prism on the insulator substrate 601 or the substrate having a surface layer comprising an insulator. If the primary seed 602 consists of a material which can stably form an oxide, the exposed surface may be oxidized, or an insulator may be deposited thereon by CVD or the like.

In any one of the types, the material of the side walls need not to be the same as that of the substrate 601. For example, in the buried types, after rectangular prismatic or cubic space is formed in the substrate an insulator film may be formed in the space, the primary seed 602 may be buried in the space, and the insulating film 603 may be then formed thereon.

In all the types shown in FIGS. 6B, 6C and 6D, the upper surface of the primary seed is covered with the insulating film 603 consisting of an insulator for the purpose of preventing the aggregation or volatalization of the primary seed during melting. The insulating film 603 may be formed by oxidizing the primary seed or depositing an insulator by CVD or the like.

Examples of materials that can be used for the primary seed melted include semiconductor elements such as Si, Ge, Sn and the like; metals such as Au, Ag, Cu, Pt, Pd and the like; alloys; compounds; and mixtures thereof.

$SiO_2$, $Si_xN_y$, SiON or the like can be used as the insulator (substrate) which forms the non-nucleation surfaces, as well as the insulator which covers the upper surface.

The processes in this embodiment of the present invention are described below with reference to FIG. 7.

Figure 7A:
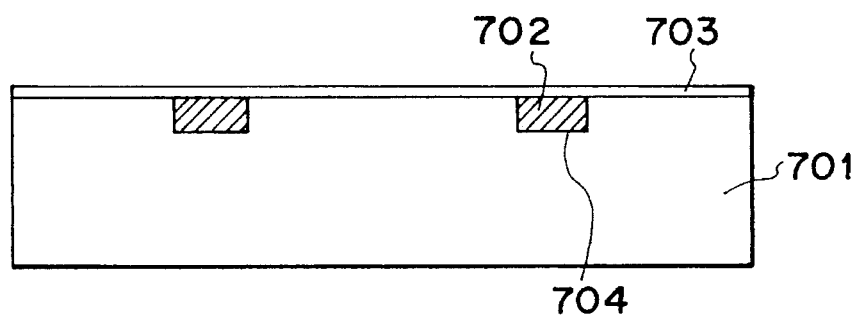
FIGS. 7A to 7D are schematic drawings showing an example of processes in a method of forming a crystal of the present invention.

Rectangular prismatic primary seed 702 is formed on the surface of a substrate 701 having an insulator surface, as described above with reference to FIGS. 6A to 6D. The whole surface including the upper surface of the primary seed 702 (the upper surface being covered with an insulating film 703) is then covered with an insulator (FIG. 7A). The substrate 701 is then heated to a temperature higher than the melting point of the primary seed 702. The heating is performed by a method using an energy beam such as a laser beam, an electron beam or the like or a lamp.

Figure 7B:
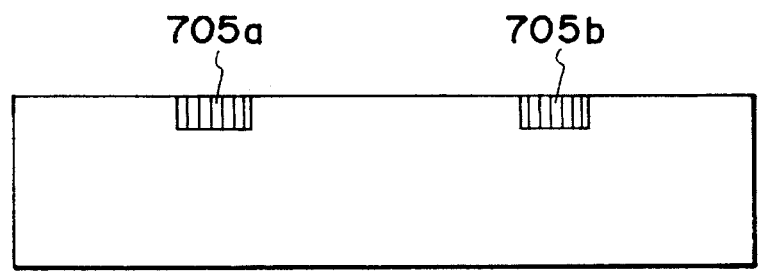

When all the primary seeds on the substrate are melted, the heating is stopped, and the melted primary seeds are then solidified. The insulating film 703 consisting of an insulator which covers the upper surfaces of the primary seeds is then removed so that monocrystalline seed crystals 705a, 705b having controlled in-plane orientation are exposed to air (FIG. 7B).

Figure 7C:
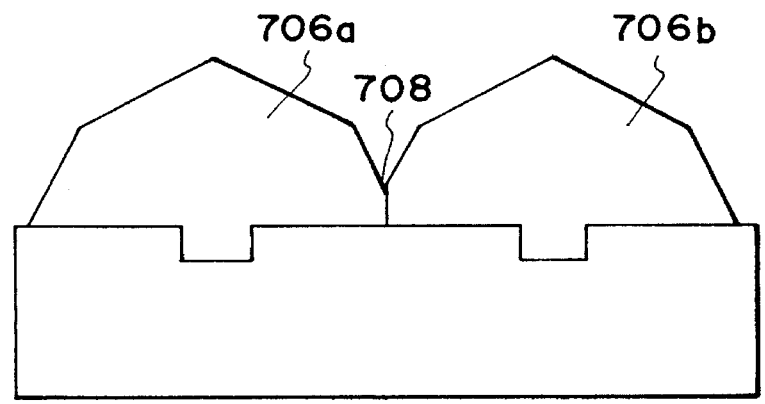

The seed crystals 705a, 705b exposed are then selectively grown by the selective CVD process. For example, if it is desired to grow Si, a chlorosilane type gas such as $SiCl_4$, $SiHCl_3$, $SiH_2Cl_2$ or the like, a silane type gas such as $SiH_4$, $Si_2H_6$ or the like, a fluorosilane type gas such as $SiF_4$, $SiH_2F_2$ or the like can be used as a source gas. At the same time, HCl gas or HF gas which has the etching function is used together with $H_2$ carrier gas. Although the temperature and pressure of the crystal growth depend upon the types of the gases used and the composition of the insulator substrate, the temperature is within the range of about 800° to 1200° C., and the pressure is within the range of several Torr to 250 Torr. The grown crystal 706a is grown while surrounded by a facet peculiar to a monocrystal and collides with the crystal 706b grown from the adjacent seed crystal 705b to form a grain boundary near the center between the two seed crystals 705a, 705b (FIG. 7C).

When it is desired to form an electron device on each of the grown crystals, if required, the crystals may be polished to form monocrystalline thin films 707a, 707b. In this case, since the position of the grain boundary 708 is known, if a device is formed on a single island, quality which is the same as or higher than that of the device formed on a monocrystal can be obtained.

A further embodiment of the present invention which employs aggregation is described below.

The crystal forming method in this embodiment comprises disposing monocrystalline seed crystal on a substrate and growing monocrystal using the seed crystal as starting point, wherein recessed portion having at least an angular portion where three surfaces comprising the bottom and two sides vertically contact with each other are formed on the surface of the substrate, primary seed is respectively disposed in the angular portions so as to contact with the three surfaces and are melted and then solidified to form monocrystalline seed crystal, and monocrystal is grown using the monocrystalline seed crystal as starting point.

In this embodiment of the invention, the orientation of the seed crystal vertical to the substrate surface can be uniformly controlled by melting and solidifying the film material. In regard to plane orientation, information about control of horizontal orientation is provided from the sides (wall surfaces) of the recessed portions, which are vertical to the substrate plane.

If crystal orientation to be controlled is equivalent to the (100) orientation, since the (100) plane is symmetric quadruply, it is theoretically possible to control in-plane orientation by disposing a primary seed to be melted and solidified on two surfaces (one bottom and one side) which cross at right angles. However, in the primary seed, the area of side is significantly smaller than that of the bottom in many cases. Even in such a case, this embodiment of the invention enables the formation of seed microcrystals having well-controlled plane orientation and in-plane orientation, and thus the simple formation of excellent crystals having single orientation because in-plane orientation can be formed.

This embodiment of the present invention is described below with reference to the drawings.

Although a description is made above with reference to FIGS. 11, 12 and 13, this embodiment is also described below with reference to these drawings.

In the example shown in FIGS. 11 and 12, a primary seed 1112 is formed so as to contact with the sides 1113, 1114 and the bottom 1115 of a recessed portion (crystal growth region) 1111. In this example, the sides 1113, 1114 and the bottom 1115 are respectively positioned as surfaces vertical to each other. The three surfaces 1113 to 1115 have good functions during melting and solidification, as described above.

The terms "the three surfaces 1113 to 1115 are vertical to each other" represent that the surfaces are strictly vertical or substantially vertical to each other. For example, even if error of several degrees or less is produced in the angles of the surfaces due to sags produced at pattern edges or deviation from the design values, which are caused by over etching, in a usual photolithographic process, etching process or the like, the surfaces are considered vertical in the present invention. In this case, the effects of the present invention can be obtained.

The shape of the primary seed 1112 is not particularly limited. However, since the primary seed 1112 is disposed so as to contact with the three surfaces 1113 to 1115, as shown in FIG. 11, the contact portions of the original seed 1112 are inevitably three vertical surfaces. The shapes of the portions of the primary seed 1112, which do not contact with the surfaces 1113 to 1115, are not particularly limited, and the portions may be formed in any shapes which can be easily formed. Although the primary seed frequently has a rectangular prismatic or cubic shape, the primary seed may comprise a sectoral or triangular grain.

The volume of the primary seed 1112 may be a value which allows the primary seed to be changed to a monocrystal containing no grain boundary by melting and solidification and which allows the three surfaces 1113 to 1115 to have good effects on the primary seed 1112. The optimum value of the volume depends upon the materials of the primary seed 1112 and of the substrate 1110. When the primary seed 1112 has a rectangular prismatic shape, as shown in FIG. 11, the length of each of the two sides $a$ and $b$ of the bottom is preferably within the range of 0.1 μm to 5 μm, and more preferably 0.5 μm to 2 μm. If the length is excessively small, it is difficult to control orientation by the stabilization energy at the interface with the substrate and to form the primary seed by photolithographic process or the like. If the length is excessively large, grain boundary is easily produced during melting and solidification. However, the occurrence of grain boundary is also related to the value of the thickness (height) $c$ of the primary seed 1112.

The value of the height $c$ of the primary seed 1112 is preferably 0.1 μm to 2 μm, and more preferably 0.3 μm to 1 μm. The optimum value of the thickness $c$ is determined by the values $a$ and $b$ and the material of the primary seed. If the $c$ value is excessively small, it is difficult to control orientation because the area of the contact surfaces with the sides 1113, 1114 is small. If the $c$ value is excessively large, grain boundary is easily produced during melting and solidification.

Even when the shape of the primary seed 1112 is not a rectangular prism, it is preferable that the sizes of the portions in direct contact with the surfaces 1113 to 1115 have values equivalent to the above values which may be regarded as standard values.

Examples of materials that can be used as the material for the primary seed 1112 include semiconductor elements such as Si, Ge, Sn and the like; metals such as Au, Ag, Cu, Pt, Pd and the like; alloys, compounds and mixtures thereof, all of which are generally known as materials for primary seed.

Various materials such as amorphous insulators such as $SiO_2$, $Si_xN_y$, $SiON_x$ and the like, which are generally known as substrate materials for forming crystal, can be used for a substrate 1110 having the recessed portion 1111. It is effective to use a substrate having a relatively low nucleation density over the whole substrate or only on the surface thereof. It is more effective to use a substrate comprising an amorphous insulator over the whole substrate or only on the surface thereof.

The processes in the above-described embodiment of the present invention are described with reference to FIGS. 13A to 13F.

As shown in FIG. 13A, recessed portion 1301 serving as crystal growth region is first formed in a substrate 1300. Although the recessed portion 1301 may be patterned with plane shapes which allow portion where the primary seed is disposed to be formed in desired angular portion. Although the depth of the recessed portion 1301 may be any desired value, the value of the depth is preferably the same as the working thickness of the film later grown. Although the method of forming the recessed portion 1301 is not particularly limited, for example, RIE (reactive ion etching) is more preferable than wet etching using an etching solution because the side 1303 of the recessed portion 1301 formed by the former method are more vertical to the bottom than the sides formed by the later method.

As shown in FIG. 13B, a material 1302' for the primary seed is then deposited. As described above, Si, Ge, Sn or the like can be used as the material 1302', and the material 1302' may be either polycrystalline or amorphous. Although the preferable value of the thickness of the deposited film is described above, the value of the thickness must be smaller than the depth of the recessed portion 1301. Examples of deposition methods include an evaporation process, a sputtering process, a CVD process and the like. However, the evaporation process and sputtering process, both of which exhibit poor step coverage, are preferable because it is undesirable that the primary seed material 1302' unnecessarily remains on the sides of the recessed portion 1301 during the subsequent process.

Etching is then performed with leaving the primary seed 1302 in a desired angular portion in the crystal growth region, as shown in FIG. 13C. The etching may be performed by either a dry method using RIE or a wet method using a solution. The preferable values of the size of primary seed 1302 are as described above with reference to FIG. 11.

The primary seed 1302 is then melted by heat treatment at a temperature higher than the melting point thereof and then solidified (recrystalized) to form monocrystalline seed crystal 1306 having uniform plane orientation and in-plane orientation, as shown in FIG. 13D. The heat treatment can be made by various means such as a laser, EB, lamp heating, high-frequency induction heating or the like. Of these means, lamp heating is preferable from the viewpoint that it is possible to treat a large area within a short time. The heat treatment may be made in an atmosphere of oxygen, nitrogen, hydrogen, rare gas or the like.

It is also preferable to coat the primary seed 1302 with a cap layer comprising $SiO_2$ or the like before the heat treatment. However, this coating is not always necessary.

Crystal 1307 is then selectively grown from the seed crystal 1306 serving as centers by the CVD process or the like, as shown in FIG. 13E. For example, when Si crystal is grown by the CVD process, a silane type gas such as $SiH_4$, $Si_2H_6$ or the like, a chlorosilane type gas such as $SiH_2Cl_2$, $SiHCl_3$, $SiCl_4$ or the like, or a fluorosilane type gas such as $SiH_2F_2$, $SiF_4$ or the like may be used as a source gas. The Si crystal can be grown by mixing the source gas with etching gas such as HCl, HF or the like in $H_2$ dilution gas. The crystal growth by the CVD process may be performed at a temperature within the range of about 800° to 1200° C. and pressure within the range of several Torr to about 200 Torr.

The crystal growth may be performed until the recessed portion serving as the crystal growth region is completely filled with crystal. The grown crystals 1307 has a facet peculiar to a monocrystal. In this way, the grown crystal 1307 can be easily determined by the size and shape of the recessed portion 1301.

As shown in FIG. 13F, the portion of the crystal 1307 which protrudes from the recessed portion 1301 is then removed so that the substrate 1300 and the crystal 1307 are flattened, whereby good device or the like can be easily formed on the flat surface, and circuit can also easily be formed.

The flattening is preferably performed by, for example, a selective polishing method in the same way as that described above.

Examples of the present invention are described below with reference to the drawings.

EXAMPLE 1

Figure 3A:
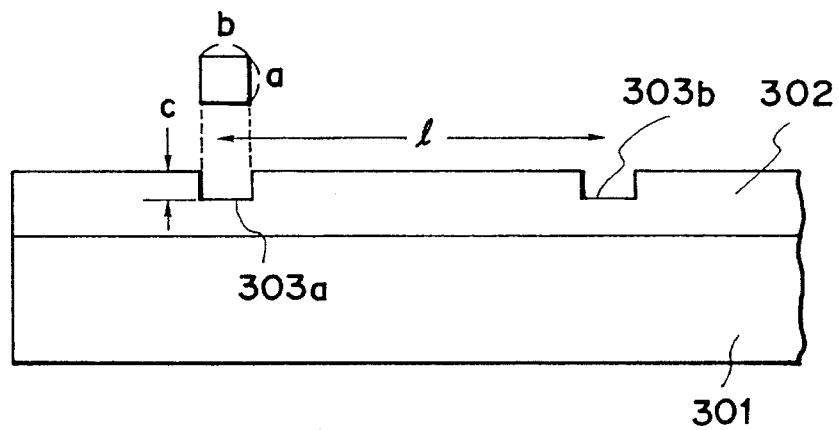
FIGS. 3A to 3C are schematic drawings showing an example of processes of forming a primary seed in a method of forming a crystal of the present invention.
Figure 3B:
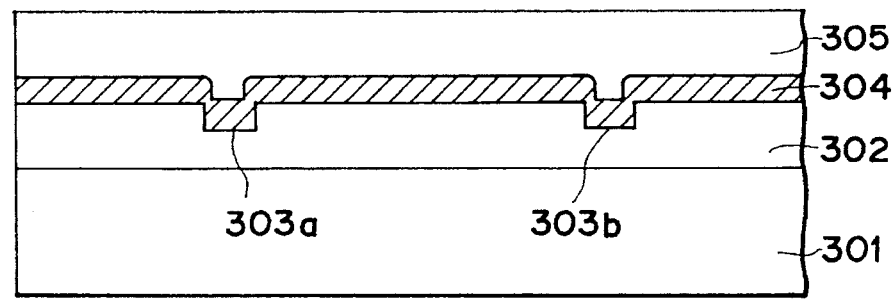
Figure 3C:
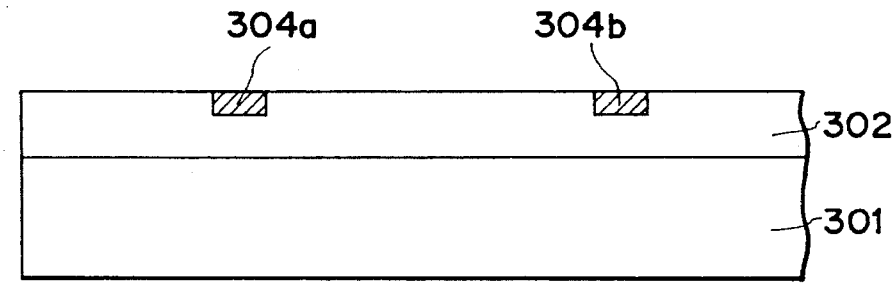

FIGS. 3A to 3C are sectional views showing the steps of forming primary seeds in Example 1 of the crystal forming method of the present invention.

Since the steps of aggregating a primary seed to form a seed crystal and growing a monocrystal using the seed crystal as starting point are the same as those described above with reference to FIGS. 2B to 2D, the steps are described below with reference to FIGS. 2B to 2D using the same reference characters.

As shown in FIG. 3A, a 4 inch Si wafer was prepared as a substrate, and the surface of the wafer was oxidized to a thickness of 1 μm to form a $SiO_2$ layer 302. The surface of the $SiO_2$ layer 302 was then partially patterned with square by a usual photoprocess, and the square portions were then etched to an intermediate position of the $SiO_2$ layer 302 by RIE (reactive ion etching). In this case, the sides a and b of each square were 0.8 μm, and the etching depth c was 0.4 μm.

A plurality of the same recessed portions were formed in a matrix with intervals l=60 μm (only recessed portions 303a, 303b are shown in FIG. 3A).

As shown in FIG. 3B, polycrystalline Si 304 was then deposited to a thickness of 0.4 μm on the substrate by the LPCVD process. Phosphorous ($^{31}P^+$) was implanted into the polycrystalline Si 304 by ion implantation so that the concentration was $8 \times 10^{20}$ cm$^{-3}$. A resist 305 was then coated on the polycrystalline Si 304 doped with phosphorous so that the surface was flattened.

As shown in FIG. 3C, both the polycrystalline layer Si 304 and the resist were then etched back by RIE under the conditions that the etching rate of the polycrystalline Si was the same as that of the resist until the surface of the $SiO_2$ layer 302 was exposed so that polycrystalline Si 304a and 304b remained only in the recessed portions. The polycrystalline Si 304a and 304b were used as primary seeds. The etching back conditions were that OFPR5000 was used as the resist, and RIE was effected by using a gas mixture $C_2F_6/O_2$ (80/35 sccm) at a pressure of 50 pa. with output of 2 kW.

The thus-formed polycrystalline Si 304a and 304b respectively filled in the rectangular prismatic recessed portions were then subjected to heat treatment at a pressure of 100 Torr and a temperature of 1050° C. for 10 minutes in an atmosphere of hydrogen, as shown in FIG. 2B. As a result, the polycrystalline Si 304a and 304b were aggregated in a solid phase and changed to monocrystals 204a and 204b, respectively, each having a semispherical surface.

Si crystals were then selectively grown from the Si monocrystalline Si 204a and 204b which were formed by aggregation and which served as seed crystals, as shown in FIG. 2C. The crystal growth was carried out at a temperature of 1030° C. and a pressure of 80 Torr for a growing time of 90 minutes under the conditions that the substrate was placed in a gas mixture of $SiH_2Cl_2$ as a source gas, HCl as an additive gas for etching and $H_2$ as a carrier gas with a ratio of 0.53:1.6:100 (l/min). As a result, when a Si monocrystal 205a was grown to a width of 30 µm in the horizontal direction, it collided with the adjacent monocrystal 205b to form a grain boundary 206. However, all the crystals had appearances with substantially the same facet shape and direction.

The thus-obtained crystals were oriented in the (100) direction vertical to the substrate. X-ray diffraction measurement showed no other orientations. As a result of EPC (Electron Channeling Pattern) analysis of in-plane orientation, deviations are held within ±5° from orientation equivalent to (100) orientation in the patterning direction of the seed crystal.

The thus-formed crystals were then flattened for forming devices such as transistors on the crystals, as shown in FIG. 2D. The flattening was performed by the same polishing process as that for polishing a usual Si wafer in which rough polishing and finish polishing were made in turn by using a weak alkaline solution in which abrasive grains were suspended until the residual thickness was 1 µm.

EXAMPLE 2

This example is described with reference to FIGS. 4A to 4D.

Since the steps of aggregating a primary seed to form a seed crystal and growing a monocrystal using the seed crystal as starting point are the same as those described above with reference to FIGS. 2B to 2D, the steps are described below with reference to FIGS. 2B to 2D using the same reference characters.

Figure 4A:
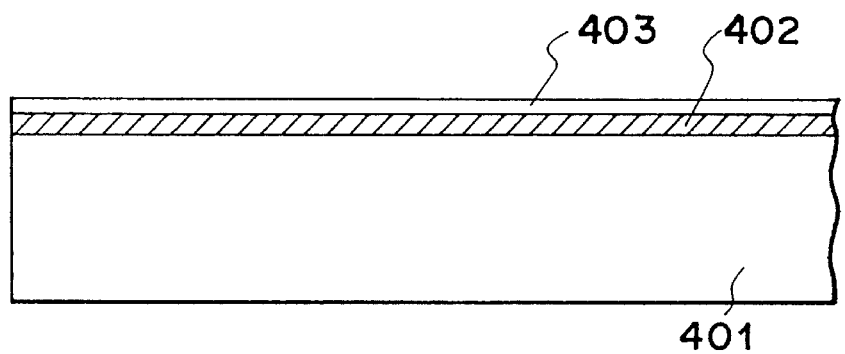
FIGS. 4A to 4D are schematic drawings showing another example of processes of forming a primary seed in a method of forming a crystal of the present invention.

Polycrystalline Si 402 was first deposited to a thickness of 0.1 µm on a fused quartz substrate 401 having a diameter of 4 inches by the LPCVD process, as shown in FIG. 4A, and a $Si_3N_4$ film 403 was then deposited to a thickness of 0.05 µm thereon by the LPCVD process, as shown in FIG. 4A.

Figure 4B:
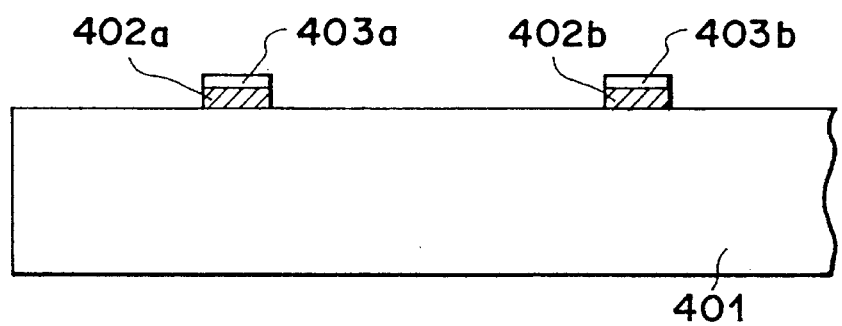

Island-like regions of 1×1 µm were then patterned at intervals of 50 µm, and the $Si_3N_4$ film and the polycrystalline Si film were then etched by RIE so that the island-like regions remained, as shown in FIG. 4B.

Figure 4C:
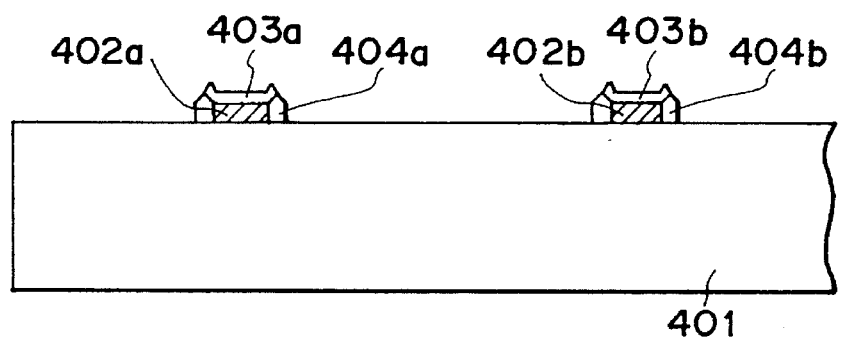

Polycrystalline Si 402a and 402b with $Si_3N_4$ film caps 403a and 403b separated in the form of islands were then oxidized as such, as shown in FIG. 4C. As a result, only the peripheral portion of each of the square polycrystalline Si 402a and 402b was oxidized so that the polycrystalline Si 402 and 402b were surrounded by $SiO_2$ walls 404a and 404b, respectively, as viewed from above the substrate.

Figure 4D:
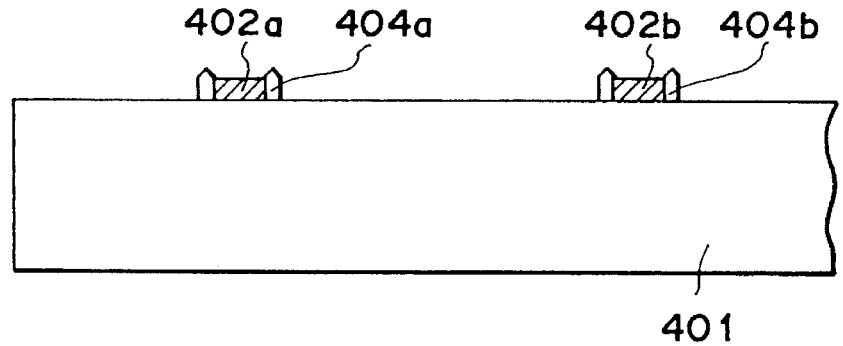

Only the $Si_3N_4$ layers 403a and 403b on the polycrystalline Si 402 were then etched by using hot phosphoric acid ($H_3PO_4$), as shown in FIG. 4D.

The polycrystalline Si 204a and 204b were then aggregated to selectively grow in accordance with the same steps as shown in FIGS. 2A to 2D under the same conditions as those used in Example 1. The flattening is similarly carried out.

EXAMPLE 3

Figure 5A:
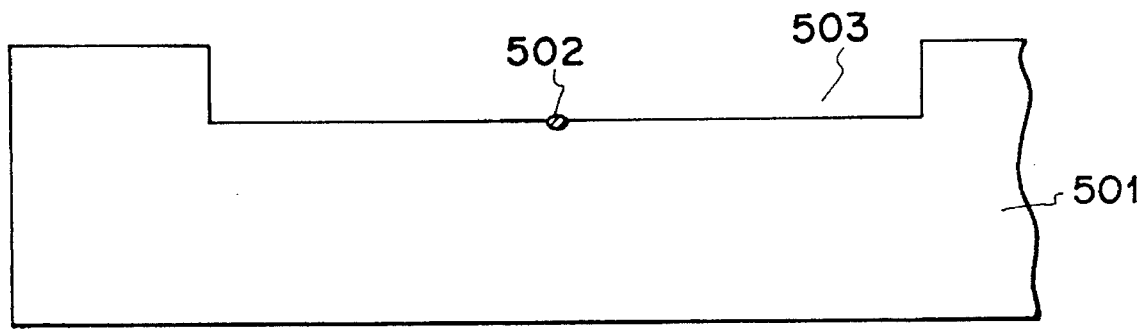
FIGS. 5A to 5C are schematic drawings showing an example of processes in a method of forming a crystal of the present invention.
Figure 5B:
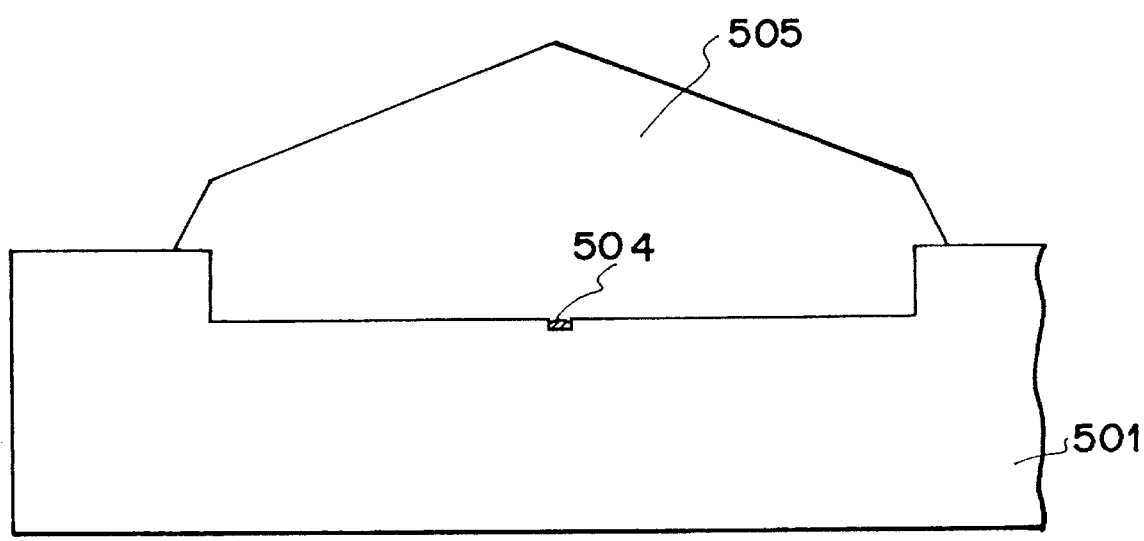
Figure 5C:
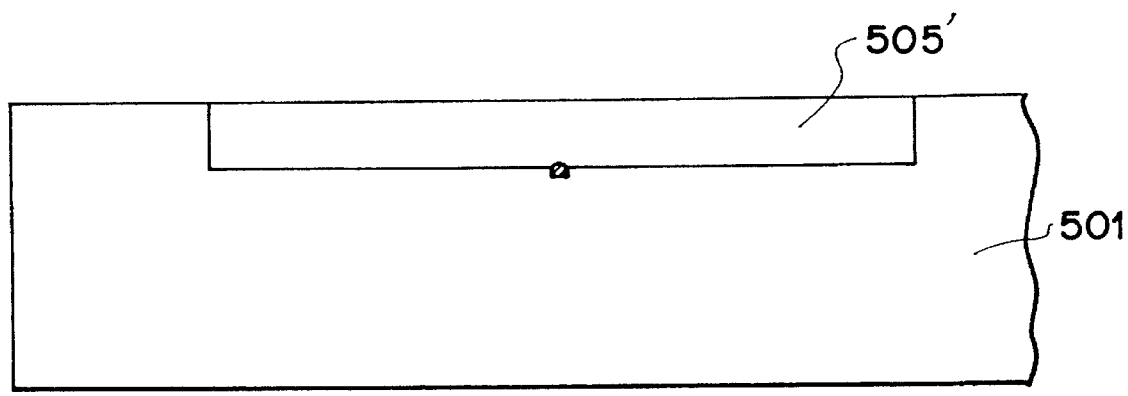

FIGS. 5A to 5C are sectional views showing the steps in Example 3 of the crystal forming method of the present invention.

As shown in FIG. 5A, a recessed portion with a region of 40 µm×40 µm and a depth of 0.8 µm on the surface of a fused quartz substrate 501 having a diameter of 4 inch was etched by the etching process using photolithography and RIE to form a crystal growth region 503. The crystal growth region 503 was formed in a lattice pattern with intervals of 60 µm in terms of the distance between the centers of squares.

A square region of 0.7×0.7 µm² at the center of the bottom of each crystal growth region was further etched to a depth of 0.2 µm to form a seed crystal forming region.

Ge was then deposited to a thickness of 0.2 µm over the whole surface of the quartz substrate 501 by the sputtering deposition process. The Ge deposited on the portions except the seed crystal forming region was then removed by etching back according to the same method as that employed Example 1. As a result, a Ge primary seed 502 remained in the seed crystal forming region.

As shown in FIG. 5B, the substrate having the Ge primary seed 502 was then subjected to heat treatment at 80 Torr and 750° C. in an atmosphere of hydrogen so that the primary seed was aggregated to form a seed crystal 504 of monocrystalline Ge.

Si crystal was then selectively grown using the monocrystal Ge as starting point in a vapor phase to form Si monocrystal 505 having a size of about 50 µm. The conditions for crystal growth were the same as those used in Example 1.

The thus-obtained crystal was then flattened by the same method as that employed in Example 1 according to the usual process of polishing Si wafers. However, in the polishing process, colloidal silica was used as abrasive grains, and the polishing rate was adjusted to be low immediately before the polished surfaces of the crystals reached the surface of the quartz substrate 501. The polishing was finished when the Si crystal surface was at the same level as that of the surface of the quartz substrate 501.

The Si monocrystal 505∝ obtained by the above-described crystal growth and polishing are completely separated from each other and have a completely flat surface.

When the plane orientation of each of the crystals was measured by micro X-ray diffractometry, all the crystals showed extremely good orientation with a deviation within ±3° from the (100) plane. No peak other than the (100) diffraction peak appeared in the whole X-ray diffraction chart. As a result of measurement of in-plane orientation by ECP, deviations are within ±4° from orientation equivalent to (100) orientation in the patterning direction of the seed crystal (the lattice pattern direction of the crystal growth region).

EXAMPLE 4

The surface of a 4 inch fused quartz substrate 1300 was patterned with square of 20×20 µm, as shown in FIG. 13A. The square portion was then etched to a depth of 0.4 µm by RIE to form recessed portion 1301 serving as crystal growth region.

As shown in FIG. 13B, a polycrystalline Si (material for primary seed) 1302' was then deposited to a thickness of 0.1 µm by the LPCVD process.

As shown in FIG. 13C, an island-like region was then patterned on one angular portion of the recessed portion 1301 by the usual photolithographic process, the island-like region left by etching with a solution containing HF, HNO$_3$ and CH$_3$COOH (1:40:40) was used as a primary seed 1302.

As shown in FIG. 13D, the substrate 1300 having the primary seed 1302 was then subjected to heat treatment at 1050° C. and 100 Torr for 3 minutes in an atmosphere of hydrogen. As a result, the primary seed 1302 was aggregated so as to be changed from a polycrystal to a semispherical monocrystal. The monocrystal 1306 formed by aggregation was used as a seed crystal.

As shown in FIG. 13E, Si monocrystal (grown crystal 1307) was then selectively grown using as starting point the seed crystal 1306 formed by aggregation. The crystal growth was performed at 1030° C. and 100 Torr for 55 minutes using a gas mixture containing SiH$_2$Cl$_2$ as a source gas, HCl as etching gas and H$_2$ carrier gas with a ratio of 0.53:1.6:100 (l/min). As a result, the Si monocrystal (grown crystal 1307) reached to the angular portion opposite to the angular portion where the seed crystal was disposed, and further upwardly grown beyond the angular portion. The recessed portion 1301 was completely filled with the Si monocrystal (grown crystal 1307).

As shown in FIG. 13F, the crystal grown beyond the recessed portion 1301 was then polished to obtain flat Si monocrystal 1308. The polishing was selectively effected by mechanical polishing using as an abrasive material a suspension obtained by suspending in water colloidal silica having an average size of 0.01 μm and serving as abrasive grains. On the other hand, an abrasive cloth was placed on the substrate, and the grown crystals 1307 were rubbed with the abrasive cloth while the abrasive material was poured little by little. At this time, the pressure was 220 g/cm$^2$, and the temperature was 30° to 40° C.

When the polished surface of the grown crystal 1307 reached to the surface of the fused quartz substrate 1300, the end of polishing could be recognized because the polishing rate of quartz, i.e., SiO$_2$, was extremely smaller than that of Si under the above polishing conditions.

By forming a plurality of crystal growth regions to grow crystals and then polished by the above-described method, an SOI crystal group comprising crystals with controlled plane orientation and in-plane orientation and having a flat surface could be obtained over the whole surface of the substrate.

The thus-obtained crystals had (100) orientation vertical to the substrate and showed no other orientation in X-ray diffractometry. As a result of analysis of in-plane orientation by ECP (Electron Channeling Pattern), deviations were within ±12° from orientation equivalent to the (100) orientation along the sides of each of the recessed portions serving as the crystal growth regions.

EXAMPLE 5

The oxide surface of substrate 1300 comprising a 4 inch Si wafer which was previously oxidized to a thickness of 1 μm was first patterned with rectangles of 15 μm×4 μm, as shown in FIG. 13A. The rectangular portion was then etched to a depth of 0.3 μm by RIE to form recessed portion 1301 serving as crystal growth region.

As shown in FIG. 13B, a Ge film (material for primary seed 1302') was then deposited to a thickness of 0.2 mm by the EB deposition process.

As shown in FIG. 13C, a square region with sides of 1.5 μm was then patterned in an angular portion of the recessed portion 1301, and the other portions were etched by RIE with leaving the square regions serving as primary seed 1302.

As shown in FIG. 13D, the substrate 1300 having the Ge primary seed 1302 was then subjected to heat treatment at 750° C. and 80 Torr in an atmosphere of hydrogen so that the primary seed 1302 was aggregated to form the seed crystal 1306 of monocrystal Ge.

As shown in FIG. 13E, Si crystal (grown crystal 1307) was then selectively grown to a size of about 20 μm from a vapor phase using the Ge seed crystal 1306 as starting point. This crystal growth was performed at 80 Torr and 900° C. for 60 minutes using a gas mixture of SiH$_2$Cl$_2$, HCL and H$_2$ (0.53/1.05/100).

As shown in FIG. 13F, the Si crystal 1307 was then polished by the same method as that employed in Example 4 to obtain a flat SOI crystal.

The thus-obtained crystal had (100) orientation vertical to the substrate and showed no other orientation in X-ray diffractometry. As a result of analysis of in-plane orientation by ECP, deviations were within ±10° from orientation equivalent to the (100) orientation along the side direction of recessed portion.

Examples of the present invention which employ melting of primary seed are described below.

EXAMPLE 6

This Example is described below with reference to FIGS. 8A to 8C and 9A to 9D.

Figure 8A:
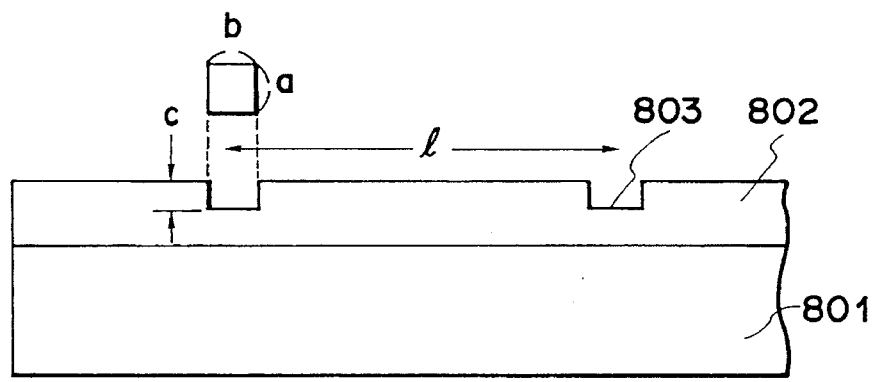
FIGS. 8A to 8C, FIGS. 9A to 9D and FIGS. 10A to 10C are schematic drawings respectively showing examples of processes in a method of forming a crystal of the present invention.

As shown in FIG. 8A, the surface of a substrate 801 comprising a 4 inch Si wafer was first oxidized to a thickness of 1 μm to form an SiO$_2$ layer 802 thereon. A square was then patterned on a portion of the surface of the SiO$_2$ layer 802 by the usual photoprocess and then etched to an intermediate position of the SiO$_2$ layer by RIE (reactive ion etching). In this Example, the length of one side of the square (a=b) was 0.8 μm, and the depth c of the etched portion was 0.4 μm. A plurality of the same recessed portions 803 as that formed by the above method were formed in a matrix with intervals 1 of 60 μm.

Figure 8B:
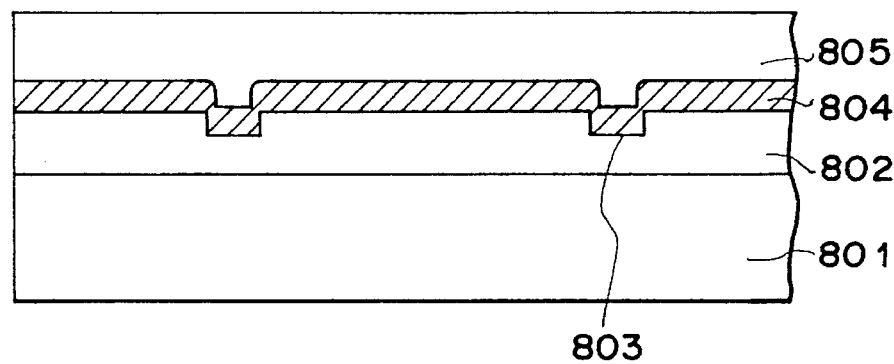

As shown in FIG. 8B, a polycrystal Si 804 was then deposited to a thickness of 0.4 μm on the substrate by the LPCVD process. A resist 805 was further coated on the polycrystalline Si 804 so that the surface become flat.

Figure 8C:
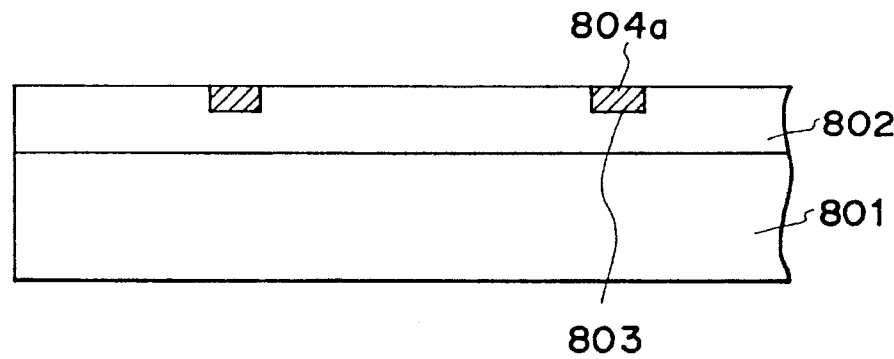

As shown in FIG. 8C, both the resist 805 and the polycrystalline Si 804 were then etched back by RIE under the conditions (described below) that the etching rate of the resist 805 was the same as that of the polycrystalline Si 804 until the surface of the SiO$_2$ layer 802 was exposed so that the polycrystalline Si 804a remained only in the recessed portion 803. The etching back was performed by using resist OFPR5000, and RIE was performed by using a gas mixture of C$_2$F$_6$ and O$_2$ (80/35 sccm) at a pressure of 50 pa. and output of 2 kW.

As shown in FIG. 7A, an SiO$_2$ layer 703 was then deposited to a thickness of 0.6 μm on the flat surface by the atmospheric CVD process. The surface of the substrate was then heated to a set temperature of 1420° C. by applying infrared light thereto (from the side of the polycrystalline Si) using a lamp heating apparatus. After the temperature was kept for 30 seconds, heating was stopped. This heating method enabled the formation of the state wherein only the surface polycrystalline Si 702 was melted, without melting the substrate Si.

As shown in FIG. 7B, the $SiO_2$ layer 703 of 0.6 μm used as a cap layer was then removed by using buffered hydrofluoric acid so that the surfaces of monocrystalized Si 705a and 705b were exposed.

As shown in FIG. 7C, Si monocrystals were selectively grown using the monocrystalized Si 705a and 705b as seed crystals. The crystal growth was performed at a temperature of 1030° C. and a pressure of 80 Torr for a time of 100 minutes under the condition that the substrate was placed in a gas mixture containing $SiH_2Cl_2$ as a source gas, HCl as an etching added gas and $H_2$ as a carrier gas with a ratio of 0.53:2.0:100 (l/min). The thus-grown crystals 706a and 706b collided with each other at an intermediate position between the seed crystals 705a and 705b to form a grain boundary 708. All the crystals had the appearances with the same facet shape and facet direction. The thus-obtained crystals had (100) orientation vertical to the substrate and showed no other orientation in X-ray diffractometry. As a result of analysis of in-plane orientation by ECP (Electron Channeling Pattern), deviations were within ±5° from orientation equivalent to the (100) orientation in the patterning direction of the seed crystal.

Figure 7D:
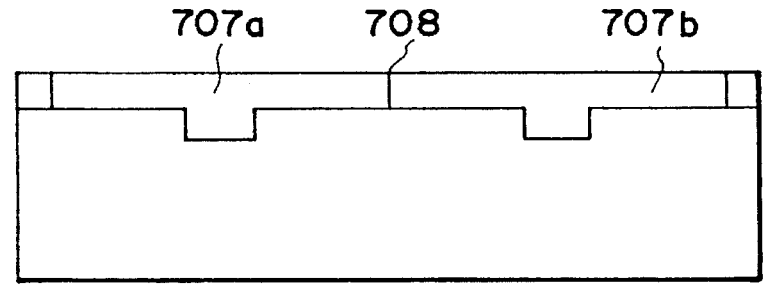

As shown in FIG. 7D, the thus-formed crystals were then flattened for forming devices such as transistors or the like thereon. The flattening was performed until the thickness of the crystals 707a and 707b was 1 μm by the completely same process for polishing general Si wafer in which rough polishing and finish polishing were effected in turn by using a weak alkaline solution in which abrasive grains were suspended. When an n-MOS transistor was formed on each of the flattened crystals by a usual semiconductor process, there were substantially no deviation in the electrical properties of the transistors formed, and the electrical properties and deviations were substantially the same as those of the n-MOS transistors simultaneously formed on a Si wafer.

EXAMPLE 7

This Example is described with reference to FIGS. 9A to 9D and 7A to 7D.

Figure 9A:
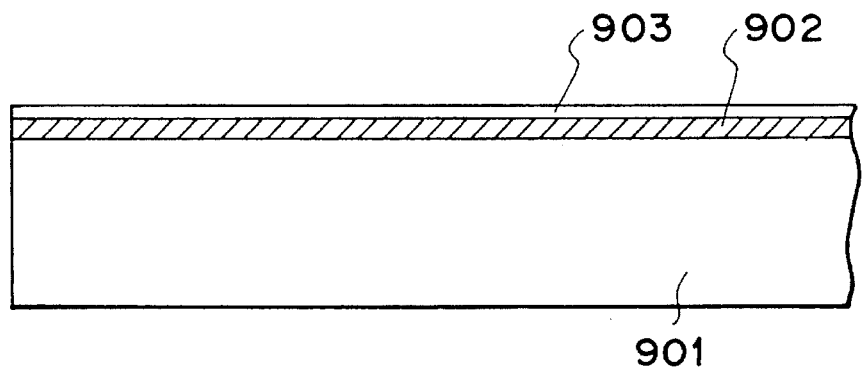

As shown in FIG. 9A, an Si polycrystal 902 was deposited to a thickness of 0.1 μm on a fused quartz substrate 901 with a diameter of 4 inch by the LPCVD process, and an $Si_3N_4$ film was further deposited to a thickness of 0.05 μm by the LPCVD process.

Figure 9B:
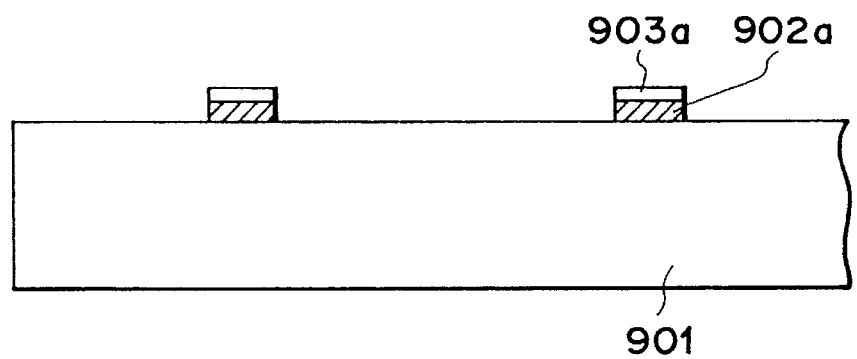

As shown in FIG. 9B, island-like regions of 1×1 mm² were patterned at intervals of 50 μm in the Si polycrystal film 902 and the $Si_3N_4$ film 903, all the portions of the $Si_3N_4$ film 903 and the Si polycrystal film other than island-like region being etched by RIE.

Figure 9C:
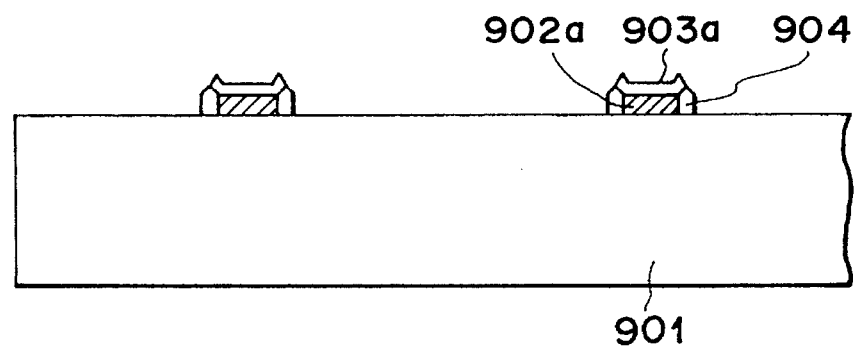

As shown in FIG. 9C, the separate island-like polycrystalline Si regions 902a with the $Si_3N_4$ cap films 903a were then oxidized to a depth of 0.1 μm. As viewed from above the substrate, the square polycrystalline Si 902a was oxidized only in the peripheral portion thereof and surrounded by the $SiO_2$ wall 904, the $Si_3N_4$ cap film 903a and the ground fused quartz substrate 901.

The substrate in this state was then heated by applying infrared light thereto from both sides thereto at a set temperature of 1500° C. for 60 seconds using a lamp heating apparatus. Although the temperature of the fused quartz substrate 901 itself was slightly increased to about 400° C. because substantilly no infrared light was absorbed by the substrate 901, the Si film 902a which absorbed a large quantity of infrared light was melted at a temperature higher than the melting point thereof.

Figure 9D:
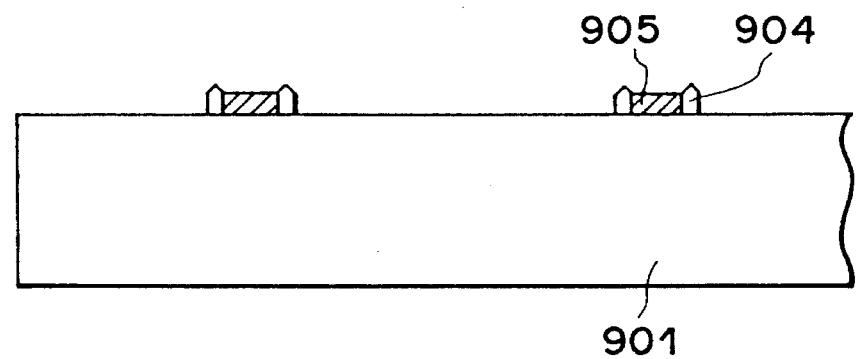

As shown in FIG. 9D, after the melted Si had been solidified to a monocrystal in the off state of the lamp heating apparatus used, the $Si_3N_4$ cap layers 903a were etched by using hot phosphoric acid ($H_3PO_4$, 300° C.). The $SiO_2$ side wall 904 of the monocrystal Si 905 was then etched by using buffered hydrofluoric acid.

As shown in FIGS. 7C to 7D, the monocrystalized Si was selectively grown by the same process as that employed in Example 6 using as seed crystals the monocrystal Si 905. The conditions of crystal growth were as follows:

$SiH_2Cl_2$:HCl:$H_2$=0.53:1.6:100 (l/min), 1030° C., 800 Torr, 75 minutes

The thus-obtained crystal had controlled orientation, like the crystal obtained by the method in Example 6. The n-MOS transistors formed on the crystal had the same characteristics as those of the transistors formed in Example 6.

EXAMPLE 8

Polycrystalline Si was patterned according to the same processes as those employed in Example 6 to form the state shown in FIG. 7A.

The polycrystalline Si 704 was melted by applying Ar ion laser with a wavelength of 5145 Å thereto. The laser had output of 5 W and the beam diameter of 0.5 mm, and was scanned at a speed was 20 mm/second. The melted Si was then solidified to form a monocrystal which was then used as seed crystal for growing a monocrystalline Si under the same conditions as those employed in Example 6. The crystals obtained had controlled orientation, like the crystals obtained by the method of Example 6, and the n-transistors formed on the crystals had the same characteristics as those of the transistors formed in Example 6.

EXAMPLE 9

A materials used as a primary seed was patterned according to the same processes as those employed in Example 6 to form the state shown in FIG. 7A with the exception that a polycrystalline Ge was used as a material for the primary seed in place of the polycrystalline Si used in Example 6. The polycrystalline Ge was deposited by the evaporation method. Since the melting point of Ge was as low as 937° C., and lower than that Si, Ge was melted by annealing at a set temperature or 1000° C. for 20 minutes in an annealing furnace used for usual silicon processes.

The thus-formed and monocrystalized Ge was used as seed crystal to selectively grow Si monocrystal. The grown crystal had (100) orientation vertical to the substrate, like the crystals grown using Si as seed crystal. The in-plane orientation also formed a surface equivalent to (100) orientation along each of the plane direction of a rectangular prismatic seed crystal forming region.

EXAMPLE 10

Figure 10A:
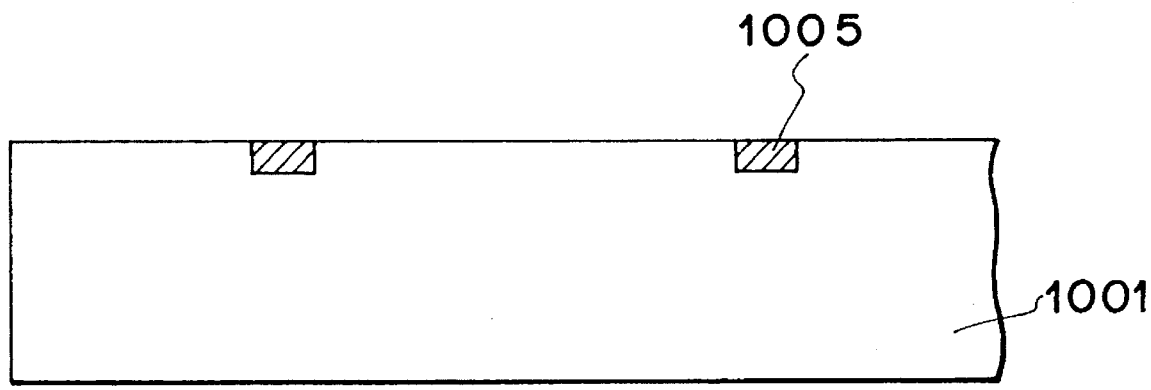

As shown in FIG. 10A, the polycrystalline Si buried in recessed portion formed in the surface off a substrate 1001 was melted by lamp heating to form a monocrystalline seed 1005 having controlled orientation, like in Example 6. However, a fused quartz substrate was used as a the substrate 1001 in place of the Si wafer used in Example 6.

Figure 10B:
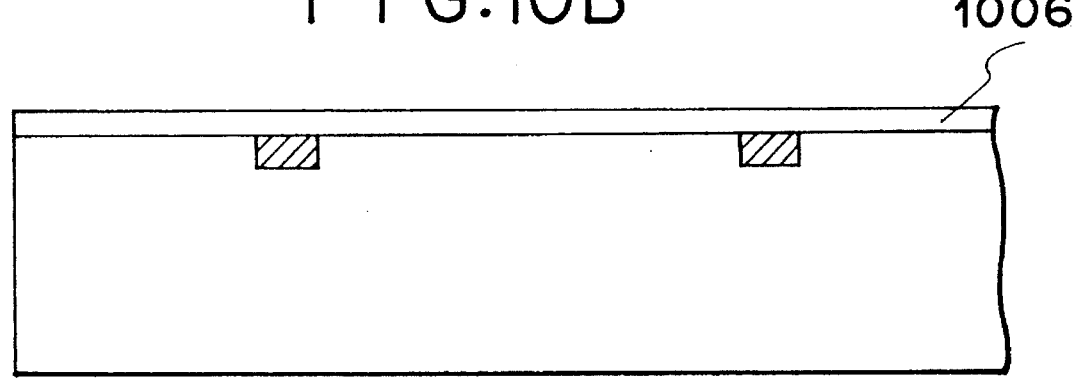

As shown in FIG. 10B, a polycrystalline Si 1006 was deposited to 0.1 μm on the surface of the substrate 1001 by the LPCVD process, and Si ions were then implanted to the polycrystalline Si deposited make it amorphous. The implantation conditions were that the acceleration voltage was 60 kV, and the dose was $1\times10^{15}$ cm$^2$. These conditions were determined so that the projection range was extended to a position on the Si film side near the interface between the polycrystalline Si and the fused quartz substrate.

Figure 10C:
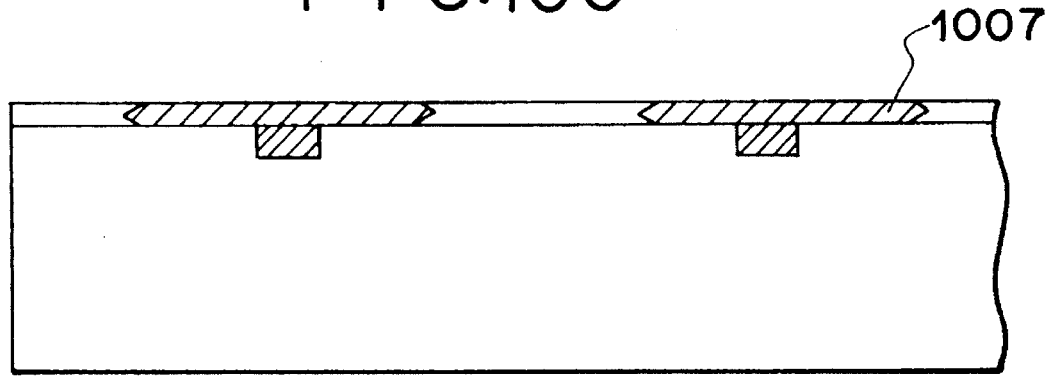

As shown in FIG. 10C, the substrate was then annealed in the annealing furnace at 600° C. for 50 hours in an atmosphere of $N_2$. In the amorphous Si film 1006, the crystal 1007 was grown a solid phase using the seed crystal 1005 of monocrystal as starting point. As a result, a crystal film having uniform (100) orientation was obtained.

EXAMPLE 11

As shown in FIG. 13A, squares of 20×20 μm$^2$ were first patterned on the surface off a 4-inch melted quartz substrate 1300. The square portion was then etched to a depth of 1.0 μm by RIE to form recessed portion 1301 serving as crystal growth region.

As shown in FIG. 13B, a polycrystalline Si (material 1302' for primary seed) was then deposited to a thickness of 0.5 μm by the LPCVD process.

As shown in FIG. 13C, an island-like region of 3.0 μm×3.0 μm was then patterned in an angular portion of the recessed portion 1301 by the usual photolithographic process, the portions other than the portion etched with a solution containing HF, $HNO_3$ and $CH_3COOH$ at a ratio of 1:40:40 being left the island-like regions serving as primary seeds 1302. An $SiO_2$ cap layer was further deposited to a thickness of 0.5 μm on the substrate 1300 by the atmospheric CVD process.

As shown in FIG. 13D, the substrate 1300 was then subjected to heat treatment using a lamp heating apparatus at 1410° C. for 90 seconds in an atmosphere of nitrogen. As a result, the primary seed 1302 was melted and then solidified in a semispherical form so that a polycrystal was changed to a monocrystal. The monocrystal 1306 formed by aggregation was used as the seed crystal.

As shown in FIG. 13E, after the $SiO_2$ cap layer was removed by diluted hydrofluoric acid, Si monocrystal (grown crystal 1307) was selectively grown by using as starting point the seed crystal 1306 formed by melting and solidification. The selective crystal growth was performed by using a gas mixture of $SiH_2Cl_2$ as a source gas, HCl as an etching gas and $H_2$ as a carrier gas at a ratio of 0.53:1.6:100 (l/min) at 1030° C. and 100 Torr for 55 minutes. As a result, the Si monocrystal (grown crystal 1307) reached the angular portion opposite to the angular portion where the seed crystal 1306 was disposed and was further upwardly grown beyond the angular portion. The recessed portion 1301 was completely filled with the Si monocrystal (grown crystal 1307).

As shown in FIG. 13F, the crystal portion grown beyond the recessed portion 1301 was polished to obtain a flat Si monocrystal 1308. The polishing was selectively effected by mechanical polishing using an abrasive material which was obtained by suspending in water colloidal silica having an average size of 0.01 μm and used as abrasive grains. On the other hand, an abrasive cloth was placed on the substrate, and the grown crystals 1307 were rubbed with the abrasive cloth while the abrasive material was poured little by little. At this time, the pressure was 220 g/cm$^2$, and the temperature was 30° to 40° C.

When the polished surfaces of the grown crystal 1307 reached the surface of the fused quartz substrate 1300, the end of polishing could be recognized because the polishing rate of quartz, i.e., $SiO_2$, was extremely lower than that of Si under the above polishing conditions.

By forming a plurality of crystal growth regions and growing crystals to then polish by the above-described method, an SOI crystal group comprising crystals having controlled plane orientation and in-plane orientation and having a flat surface could be obtained over the whole surface of the substrate.

The thus-obtained crystals had (100) orientation vertical to the substrate and showed no other orientation in X-ray diffraction pattern. As a result of analysis of in-plane orientation by ECP (Electron Channeling pattern), deviations were within ±7° from orientation equivalent to (100) orientation along the side of recessed portion serving as a crystal growth region.

EXAMPLE 12

As shown in FIG. 13A, the surface of a substrate 1300 comprising a 4 inch wafer whose surface was oxidized to a depth of 1 μm was first patterned with rectangles of 15 μm×4 μm. The rectangular portion was then etched to a depth of 0.3 μm by RIE to form recessed portion 1301 serving as crystal growth region.

As shown in FIG. 13B, a Ge film (material 1302' for primary seed) was then deposited to a thickness of 0.2 mm by the EB evaporation method.

As shown in FIG. 13C, a square region was then patterned in an angular portion of the recessed portion 1301, the portions other than the portions etched by RIE being left the square region which was then used as primary seed 1302.

As shown in FIG. 13D, the substrate 1300 having the Ge primary seed 1302 was then subjected to heat treatment at 940° C. for 3 minutes in an atmosphere of hydrogen so as to be melted and then solidified to obtain the seed crystal 1306 of monocrystalline Ge.

As shown in FIG. 13E, Si crystal (grown crystal 1307) was selectively grown to a size of about 20 μm from a vapor phase using as starting point the Ge seed crystal 1306. The crystal growth was performed by using a gas mixture of $SiH_2Cl_2$, HCl and $H_2$ (0.53/1.05/100 (l/min)) at 900° C. and 80 Torr for 60 minutes.

As shown in FIG. 13F, the Si crystal 1307 was polished by the same method as that employed in Example 11 to obtain a flat SOI crystal.

The thus-obtained crystal had (100) orientation and showed no other orientation in X-ray diffractometry. As a result of ECP analysis of in-plane orientation, deviations were with ±5° from orientation equivalent to (100) orientation along the side direction of the recessed portion.

What is claimed is:

1. A crystal forming method which comprises;
   (a) forming a polycrystalline semiconductor layer on a substrate having an amorphous surface;
   (b) forming an insulating layer on the polycrystalline semiconductor layer;
   (c) partially removing the polycrystalline semiconductor layer and the insulating layer to leave a polycrystalline semiconductor region which can become a primary seed to singly aggregate;
   (d) forming an insulating region at a side portion of the polycrystalline semiconductor region to cover the polycrystalline semiconductor region with an insulating material;

(e) removing the insulating layer existing on the polycrystalline semiconductor region;

(f) performing a heat treatment for aggregating the polycrystalline semiconductor region as the primary seed to form a monocrystalline seed crystal having a controlled plane orientation; and (g) selectively growing monocrystal by a crystal growth treatment using the seed crystal as a starting point.

2. A crystal forming method according to claim 1, wherein said substrate has at least a surface with a low nucleation density.

3. A crystal forming method according to claim 2, wherein said surface with a low nucleation density comprises at least an amorphous insulating surface.

4. A crystal forming method according to claim 1, wherein the temperature of said heat treatment is lower than the melting point of said primary seed.

5. A crystal forming method according to claim 1, wherein said primary seed is subjected to heat treatment in an atmosphere of hydrogen.

6. A crystal forming method which comprises:

(a) providing a substrate having a recessed portion, the surface of the recessed portion comprising an amorphous material;

(b) forming a polycrystalline semiconductor layer on the surface of the recessed portion;

(c) partially removing the polycrystalline semiconductor layer to leave a polycrystalline semiconductor region which can become a primary seed to singly aggregate at one angular portion of the recessed portion;

(d) performing a heat treatment for aggregating the polycrystalline semiconductor region as the primary seed to form a monocrystalline seed crystal having a controlled plane orientation; and (e) selectively growing monocrystal by a crystal growth treatment using the seed crystal as a starting point.

7. A crystal forming method according to claim 6, wherein said heat treatment of said primary seed is performed in an atmosphere of hydrogen.

8. A crystal forming method according to claim 6, wherein said plane orientation (100) is vertical to said substrate.

9. A crystal forming method according to claim 6, wherein said recessed portion is completely filled with said grown monocrystal.

10. A crystal forming method which comprises:

(a) providing a substrate having a recessed portion, the surface of the recessed portion comprising an insulating material;

(b) forming a semiconductor material or a metal material region in said recessed portion so that a side wall of said region comes in contact with a side wall of said recessed portion, said region having a sufficient size to become a primary seed to singly aggregate;

(c) performing a heat treatment for aggregating said region as the primary seed to form a monocrystalline seed crystal having a controlled plane orientation; and (d) selectively growing a monocrystal by a crystal growth treatment using the seed crystal as a starting point.

11. A crystal forming method which comprises:

(a) forming a semiconductor material layer or a metal material layer on a substrate having an insulating surface;

(b) forming an insulating layer on said semiconductor material layer or said metal material layer;

(c) partially removing the semiconductor material layer or the metal material layer leaving a semiconductor material region or a metal material region which can become a primary seed to singly aggregate;

(d) forming an insulating region at a side portion of the semiconductor material region or the metal material region by covering the semiconductor material region or the metal material region with an insulating material;

(e) removing the insulating layer existing on the semiconductor material region or the metal material region;

(f) performing a heat treatment for aggregating the semiconductor material region or the metal material region as the primary seed to form a monocrystalline seed crystal having controlled plane orientation; and (g) selectively growing a monocrystal by crystal growth treatment using the monocrystalline seed crystal as a starting point.

12. A crystal forming method which comprises:

(a) providing a substrate having a recessed portion, the surface of the recessed portion comprising an insulating material;

(b) forming a semiconductor material layer or a metal material layer on the surface of the recessed portion;

(c) partially removing the semiconductor material layer or the metal material layer leaving a semiconductor material region or metal material region which can become a primary seed to singly aggregate at one angular portion of the recessed portion;

(d) performing a heat treatment for aggregating the semiconductor material region or the metal material region as the primary seed to form a monocrystalline seed crystal having a controlled plane orientation; and (e) selectively growing a monocrystal by a crystal growth treatment using the seed crystal as a starting point.

13. A crystal forming method which comprises:

(a) providing a substrate having a recessed portion, the surface of the recessed portion comprising an insulating material;

(b) forming a semiconductor material layer or a metal material region in said recessed portion so that a side wall of said region comes in contact with a side wall of said recessed portion, said region having a size sufficient to become a primary seed to singly melt and solidify;

(c) forming an insulating film on said region;

(d) performing a heat treatment for melting and solidifying said region as the primary seed to form a monocrystalline seed crystal having a controlled plane orientation; and (e) selectively growing a monocrystal by a crystal growth treatment using the seed crystal as a starting point.

14. A crystal forming method which comprises:

(a) forming a semiconductor material layer or a metal material layer on a substrate having an insulating surface;

(b) forming an insulating layer on said semiconductor material layer or said metal material layer;

(c) partially removing the semiconductor material layer or the metal material layer leaving a semiconductor material region or a metal material region which can become a primary seed to singly aggregate;

(d) forming an insulating region at a side portion of the semiconductor material region or the metal material region by covering the semiconductor material region or the metal material region with an insulating material;

(e) removing the insulating layer existing on the semiconductor material region or the metal material region;

(f) performing a heat treatment for melting and solidifying the semiconductor material region or the metal material region as the primary seed to form a monocrystalline seed crystal having controlled plane orientation; and (g) selectively growing a monocrystal by a crystal growth treatment using the seed crystal as a starting point.

15. A crystal forming method which comprises:

(a) providing a substrate having a recessed portion, the surface of the recessed portion comprising an insulating material;

(b) forming a semiconductor material layer or a metal material layer on the surface of the recessed portion;

(c) partially removing the semiconductor material layer or the metal material layer leaving a semiconductor material region or metal material region which can become a primary seed to singly melt and solidify at one angular portion of the recessed portion;

(d) performing heat treatment for melting and solidifying the semiconductor material region or the metal material region as the primary seed to form a monocrystalline seed crystal having a controlled plane orientation; and (e) selectively growing a monocrystal by a crystal growth treatment using the seed crystal as a starting point.

* * * * *

UNITED STATES PATENT AND TRADEMARK OFFICE
CERTIFICATE OF CORRECTION

PATENT NO.  : 5,580,381
DATED       : December 3, 1996
INVENTOR    : KENJI YAMAGATA It is certified that error appears in the above-identified patent and that said Letters Patent is hereby corrected as shown below:

ON TITLE PAGE

[30] Foreign Application Priority Data

"2-211307" should read --2-411037--.

[57] ABSTRACT

Line 2, "in" should read --in a--;
        Line 11, "as" should read --as the--.

COLUMN 2

Line 26,  "assuming" should read --assuming that--.

COLUMN 3

Line 36,  "monocrystal" should read --monocrystals--;
  Line 43,  "positions," should read --positions, and--;
  Line 45,  "laid-Open" should read --Laid-Open--.

COLUMN 5

Line 32,  "delete "a".

UNITED STATES PATENT AND TRADEMARK OFFICE
CERTIFICATE OF CORRECTION

PATENT NO. : 5,580,381

DATED : December 3, 1996

INVENTOR : KENJI YAMAGATA

It is certified that error appears in the above-identified patent and that said Letters Patent is hereby corrected as shown below:

COLUMN 6

Line 41,   "the-free" should read --the free--.

COLUMN 7

Line 20,   "functions" should read --function--;
   Line 29,   "plane" should read --place--;
   Line 55,   "over etching" should read --over-etching--.

COLUMN 8

Line 20,   "speed" should read --seed--;
   Line 22,   "b<2" should read --b≤2--;
   Line 66,   "sees" should read --seeds--.

COLUMN 9

Line 9,    "use" should read --used--;
   Line 36,   "crystals," should read --crystals, and--;
   Line 47,   "as" should read --as a--;
   Line 55,   "as" should read --as a--.

UNITED STATES PATENT AND TRADEMARK OFFICE
CERTIFICATE OF CORRECTION

PATENT NO. : 5,580,381

DATED : December 3, 1996

INVENTOR : KENJI YAMAGATA

It is certified that error appears in the above-identified patent and that said Letters Patent is hereby corrected as shown below:

COLUMN 10

Line 27,   "sufficient" should read --sufficiently--;
   Line 35,   "do" should read --does--.

COLUMN 11

Line 24,   "Although the" should read --The--.

COLUMN 12

Line 30,   "polishing (Japanese" should read --polishing" (Japanese--;
   Line 55,   "film" should read --film is--.

COLUMN 13

Line 36,   "over etching," should read --over-etching,--.

COLUMN 14

Line 24,   "in" should read --in a--;

UNITED STATES PATENT AND TRADEMARK OFFICE
CERTIFICATE OF CORRECTION

PATENT NO. : 5,580,381

DATED : December 3, 1996

INVENTOR : KENJI YAMAGATA

It is certified that error appears in the above-identified patent and that said Letters Patent is hereby corrected as shown below:

COLUMN 14 continued

Line 45,   "melted" should read --material--.

COLUMN 15

Line 31,   "as" should read --as a--;
   Line 32,   "wherein" should read --wherein the--;
   Line 52,   "of" should read --of the--;
   Line 58,   "orientation" should read --orientation is accomplished--.

COLUMN 16

Line 10,   "over etching" should read --over-etching--.

COLUMN 17

Line 10,   "Although the" should read --The--;
   Line 11,   "allow" should read --allow the--;
   Line 15,   "Although the" should read --The--;
   Line 20,   "are" should read --is--.

UNITED STATES PATENT AND TRADEMARK OFFICE
CERTIFICATE OF CORRECTION

PATENT NO. : 5,580,381

DATED : December 3, 1996

INVENTOR : KENJI YAMAGATA

It is certified that error appears in the above-identified patent and that said Letters Patent is hereby corrected as shown below:

COLUMN 18

Line 3,   "has" should read --have--;
   Line 27, "as" should read --as a--;
   Line 34, "square" should read --squares--.

COLUMN 19

Line 39, "as" should read --as a--.

COLUMN 20

Line 7,   "4 inch" should read --4 inches--;
   Line 20, "employed" should read --employed in--;
   Line 29, "as" should read --as a--;
   Line 42, "505$\alpha$" should read --505'--;
   Line 60, "square" should read --squares--;
   Line 62, "as" should read --as a--.

COLUMN 21

Line 3,   "process," should read --process, and--;
   Line 14, "as" should read --as a--;
   Line 18, "$H_2$" should read --$H_2$ as--.

UNITED STATES PATENT AND TRADEMARK OFFICE
CERTIFICATE OF CORRECTION

PATENT NO. : 5,580,381

DATED : December 3, 1996

INVENTOR : KENJI YAMAGATA

It is certified that error appears in the above-identified patent and that said Letters Patent is hereby corrected as shown below:

COLUMN 21 continued

Line 63,   "as" should read --as a--.

COLUMN 22

Line 3,    "RIE" should read --RIE,--;
  Line 4,    delete "with";
  Line 13,   "as" should read --as a--;
  Line 25,   "of" should read --of the--;
  Line 48,   "become" should read --became--.

COLUMN 23

Line 45,   "4 inch" should read --4 inches--;
  Line 66,   "substantilly" should read --substantially--.

COLUMN 24

Line 28,   "was" should read --of--;
  Line 39,   "A materials" should read --Materials--;
  Line 46,   "that" should read --that of--;
  Line 58,   "in" (2nd. occ.) should read --in a--.
  Line 59,   "off" should read --of--;

UNITED STATES PATENT AND TRADEMARK OFFICE
CERTIFICATE OF CORRECTION

PATENT NO. : 5,580,381

DATED : December 3, 1996

INVENTOR : KENJI YAMAGATA

It is certified that error appears in the above-identified patent and that said Letters Patent is hereby corrected as shown below:

COLUMN 24 continued

Line 62, delete "a".

COLUMN 25

Line 1, "deposited" should read --deposited to--;
  Line 10, "grown" should read --grown as--;
  Line 11, "as" should read --as a--;
  Line 16, "off" should read --of--;
  Line 18, "as" should read --as a--;
  Line 42, "as" should read --as a--;

COLUMN 26

Line 13, "pattern)," should read --Pattern),--;
  Line 15, "of" should read --of the--;
  Line 24, "as" should read --as a--;
  Line 32, "as" should read --as a--;
  Line 40, "as" should read --as a--;
  Line 54, "comprises;" should read --comprises:--.

UNITED STATES PATENT AND TRADEMARK OFFICE
CERTIFICATE OF CORRECTION

PATENT NO.  : 5,580,381

DATED       : December 3, 1996

INVENTOR    : KENJI YAMAGATA

Page 8 of 8

It is certified that error appears in the above-identified patent and that said Letters Patent is hereby corrected as shown below:

<u>COLUMN 27</u>

```
Line  8,  "growing" should read --growing a--;
Line 37,  "growing" should read --growing a--.
```

Signed and Sealed this

Twelfth Day of August, 1997

Attest:

BRUCE LEHMAN

Attesting Officer

Commissioner of Patents and Trademarks